(12) United States Patent
Zhang et al.

(10) Patent No.: US 9,824,998 B2
(45) Date of Patent: *Nov. 21, 2017

(54) DEVICE PACKAGING FACILITY AND METHOD, AND DEVICE PROCESSING APPARATUS UTILIZING DEHT

(71) Applicant: SEMIgear, Inc., Wakefield, MA (US)

(72) Inventors: Jian Zhang, Brookline, MA (US); Joshua Pinnolis, Newton, MA (US); Shijian Luo, South Hamilton, MA (US)

(73) Assignee: Semigear, Inc., Wakefield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/220,889

(22) Filed: Jul. 27, 2016

(65) Prior Publication Data

US 2016/0336293 A1  Nov. 17, 2016

Related U.S. Application Data

(63) Continuation-in-part of application No. 14/616,029, filed on Feb. 6, 2015, now Pat. No. 9,472,531.

(51) Int. Cl.
*G01R 31/26* (2014.01)
*H01L 23/00* (2006.01)
*H01L 21/66* (2006.01)

(52) U.S. Cl.
CPC ............ *H01L 24/81* (2013.01); *H01L 22/12* (2013.01); *H01L 24/83* (2013.01); *H01L 24/92* (2013.01); *H01L 2224/832* (2013.01); *H01L 2224/8385* (2013.01); *H01L 2224/83191* (2013.01); *H01L 2224/83192* (2013.01); *H01L 2224/83948* (2013.01); *H01L 2224/92143* (2013.01); *H01L 2924/06* (2013.01); *H01L 2924/20105* (2013.01); *H01L 2924/20106* (2013.01)

(58) Field of Classification Search
USPC .................................................. 438/15, 800
See application file for complete search history.

(56) References Cited

U.S. PATENT DOCUMENTS 5,120,665 A    6/1992 Tsukagoshi et al.
2013/0199577 A1  8/2013 Chen et al.

FOREIGN PATENT DOCUMENTS

| CN | 1498520 A | 5/2004 |
| CN | 101103449 A | 1/2008 |
| CN | 102029488 A | 4/2011 |
| JP | H 03029207 | 2/1991 |
| JP | H 07240217 A | 9/1995 |
| JP | H08-340174 A | 12/1996 |
| JP | 11-114667 | 4/1999 |
| JP | 2000-31183 | 1/2000 |
| JP | 2001-311005 A | 11/2001 |

(Continued)

*Primary Examiner* — Timor Karimy
(74) *Attorney, Agent, or Firm* — Harness, Dickey & Pierce, P.L.C.

(57) ABSTRACT

Provided are a device packing facility and method using DEHT and a device processing apparatus utilizing the DEHT. The device packaging facility includes a mounting unit providing bis(2-ethylhexyl) terephthalate (DEHT) between first and second devices to attach the first and second devices to each other, a processing unit thermally processing the first and second devices that are attached to each other to remove the DEHT and fix the first and second devices to each other, and a transfer unit transferring the first and second devices that are attached to each other from the mounting unit to the processing unit.

14 Claims, 28 Drawing Sheets

(56) References Cited

FOREIGN PATENT DOCUMENTS

| JP | 2002-151551 A | 5/2002 |
|----|---------------|--------|
| JP | 2004-172251 A | 6/2004 |
| JP | 2009-542019 A | 11/2009 |
| JP | 2012-033518 A | 2/2012 |
| KR | 10-2009-0099008 | 9/2009 |

DEVICE PACKAGING FACILITY AND METHOD, AND DEVICE PROCESSING APPARATUS UTILIZING DEHT

BACKGROUND OF THE INVENTION

The present invention disclosed herein relates to a device packing facility and method using DEHT and a device processing apparatus utilizing the DEHT.

When a device such as a semiconductor chip is manufactured, a packaging process for mounting the device on the other device such as a substrate is performed. Particularly, a 3D packaging technology for a 3D IC by mounting one chip on the other chip facilitates more high-density packing. Thus, shorter chip-to-chip connection a high degree of freedom in line layout may be realized to manufacture a high-performance IC.

In general, flux is used in a semiconductor packaging process while one device is mounted on the other device. The flux may be applied to a contact portion between the devices to adhere to each other.

However, the flux is harmful to the human body. In addition, if the flux remains on the device, the flux may interrupt a normal operation of the device to deteriorate performance of the device. Thus, in the typical semiconductor packaging process using the flux, it is necessary to perform processes of cleaning and drying the devices so as to remove the flux remaining on the devices after the devices are attached and bonded to each other.

SUMMARY OF THE INVENTION

The present invention provides a device packaging facility and method, which are capable of reducing the effects on the human body, equipment, and environments by using bis(2-ethylhexyl) terephthalate (DEHT) instead of flux, and a device processing apparatus utilizing the DEHT.

The present invention also provides a device packaging facility and method, which are capable of excluding cleaning and drying processes that are essentially involved before inspection is performed after devices are bonded to each other when flux is used for packaging, and a device processing apparatus utilizing the DEHT.

Embodiments of the present invention provide device packaging facilities including: a mounting unit providing bis(2-ethylhexyl) terephthalate (DEHT) between first and second devices to attach the first and second devices to each other; a processing unit thermally processing the first and second devices that are attached to each other to remove the DEHT and fix the first and second devices to each other; and a transfer unit transferring the first and second devices that are attached to each other from the mounting unit to the processing unit.

In some embodiments, the first device may include at least one of a solder ball, a semiconductor chip, and a substrate, and the second device may include at least one of the semiconductor and the substrate.

In still other embodiments, the mounting unit may immerse a protruding portion of the first device in the DEHT to apply the DEHT to the protruding portion and move at least one of the first and second devices to allow the protruding portion to contact the second device.

In even other embodiments, the mounting unit may apply the DEHT to at least one of the first and second devices and move at least one of the first and second devices to allow the first and second devices to contact each other on the portion coated with the DEHT.

In yet other embodiments, the mounting unit may apply or dispense a film or droplet formed of the DEHT to at least one of the first and second devices and move at least one of the first and second devices to allow the first and second devices to contact each other on the portion coated with the DEHT.

In further embodiments, the mounting unit may contact the first and second devices with each other and provide the DEHT to an edge of a contact portion between the first and second devices to allow the DEHT to be absorbed, stuck or wicked onto a boundary between the first and second devices.

In still further embodiments, the processing unit may preheat the first and second devices that are attached to each other at a first temperature to remove the DEHT, heat the first and second devices at a second temperature that is greater than the first temperature to melt a bonding material disposed on a contact portion between the first and second devices, and cool the first and second devices at a third temperature that is less than the second temperature to solidify the bonding material.

In even further embodiments, the first temperature may be lower than a boiling point of the DEHT, the second temperature may be greater than or equal to a melting point of the bonding material, and the third temperature may be less than the melting point of the bonding material.

In yet further embodiments, the processing unit may preheat the first and second devices that are attached to each other at a temperature of about 180° C. to about 220° C. to remove the DEHT.

In much further embodiments, the processing unit may preheat the first and second devices that are attached to each other at the temperature of about 180° C. to about 220° C. for about 60 seconds or more to remove the DEHT.

In still much further embodiments, the processing unit may preheat the first and second devices that are attached to each other under an atmospheric pressure or a pressure that is less than the atmospheric pressure to remove the DEHT.

In even much further embodiments, the processing unit may preheat the first and second devices that are attached to each other at the first temperature while exposing the first and second devices to nitrogen or nitrogen containing formic acid vapor to remove the DEHT.

In yet much further embodiments, after removing the DEHT, the processing unit may heat the first and second devices at a fourth temperature that is greater than the first temperature under an atmospheric pressure or a pressure that is less than the atmospheric pressure while exposing the first and second devices to formic acid vapor to remove impurities formed on a surface of the bonding material.

In much still further embodiments, the first and second devices that are fixed to each other may be taken out of the device packaging facility and transferred to an inspection facility.

In other embodiments of the present invention, device packaging methods include: providing bis(2-ethylhexyl) terephthalate (DEHT) between first and second devices to attach the first and second devices to each other; thermally processing the first and second devices that are attached to each other to remove the DEHT; and thermally processing the first and second devices to fix the first and second devices to each other.

In some embodiments, the first device may include at least one of a solder ball, a semiconductor chip, and a substrate, and the second device may include at least one of the semiconductor and the substrate.

In still other embodiments, the attaching of the first and second devices may include: immersing a protruding portion of the first device in the DEHT to apply the DEHT to the protruding portion; and moving at least one of the first and second devices to allow the protruding portion to contact the second device.

In even other embodiments, the attaching of the first and second devices may include: applying the DEHT to at least one of the first and second devices; and moving at least one of the first and second devices to allow the first and second devices to contact each other on the portion coated with the DEHT.

In yet other embodiments, the attaching of the first and second devices may include: providing a film formed of the DEHT to at least one of the first and second devices; and moving at least one of the first and second devices to allow the first and second devices to contact each other on the portion coated with the DEHT.

In further embodiments, the attaching of the first and second devices may include: contacting the first and second devices with each other; and providing the DEHT to an edge of a contact portion between the first and second devices to allow the DEHT to be absorbed onto a boundary between the first and second devices.

In still further embodiments, the moving of the DEHT may include preheating the first and second devices that are attached to each other at a first temperature to remove the DEHT, and the fixing of the first and second devices may include: heating the first and second devices at a second temperature that is greater than the first temperature to melt a bonding material disposed on a contact portion between the first and second devices; and cooling the first and second devices at a third temperature that is less than the second temperature to solidify the bonding material.

In even further embodiments, the first temperature may be lower than a boiling point of the DEHT, the second temperature may be greater than or equal to a melting point of the bonding material, and the third temperature may be less than the melting point of the bonding material.

In yet further embodiments, the removing of the DEHT may include preheating the first and second devices that are attached to each other at a temperature of about 180° C. to about 220° C.

In much further embodiments, the preheating of the first and second devices may include preheating the first and second devices that are attached to each other at the temperature of about 180° C. to about 220° C. for about 60 seconds.

In still much further embodiments, the removing of the DEHT may include preheating the first and second devices that are attached to each other under an atmospheric pressure or a pressure that is less than the atmospheric pressure.

In still much further embodiments, the removing of the DEHT may include preheating the first and second devices that are attached to each other at the first temperature while exposing the first and second devices to nitrogen or nitrogen containing formic acid vapor.

In even much further embodiments, the device packaging methods may further include, after the removing of the DEHT, heating the first and second devices at a fourth temperature that is greater than the first temperature under an atmospheric pressure or a pressure that is less than the atmospheric pressure while exposing the first and second devices to formic acid vapor to remove impurities formed on a surface of the bonding material.

In yet much further embodiments, the first and second devices that are fixed to each other may be taken out of the device packaging facility and be inspected by an inspection facility.

In still other embodiments of the present invention, device processing apparatuses include: a process chamber, a device support and a heater. The first and second devices are attached to each other using bis(2-ethylhexyl) terephthalate (DEHT) and then thermally processed within the process chamber to remove the DEHT and permanently affix the first device to the second device. The device support is disposed within the process chamber to support the first and second devices that are attached to each other. The heater heats the first and second devices that are attached to each other.

In some embodiments, the first device may include at least one of a solder ball, a semiconductor chip, and a substrate, and the second device may include at least one of the semiconductor and the substrate.

In still other embodiments, the heater may preheat the first and second devices that are attached to each other at a first temperature to remove the DEHT, heat the first and second devices at a second temperature that is greater than the first temperature to melt a bonding material disposed on a contact portion between the first and second devices, and cool the first and second devices at a third temperature that is less than the second temperature to solidify the bonding material.

In even other embodiments, the first temperature may be lower than a boiling point of the DEHT, the second temperature may be greater than or equal to a melting point of the bonding material, and the third temperature may be less than the melting point of the bonding material.

In yet other embodiments, the heater may preheat the first and second devices that are attached to each other at a temperature of about 180° C. to about 220° C. to remove the DEHT.

In further embodiments, the heater may preheat the first and second devices that are attached to each other at the temperature of about 180° C. to about 220° C. for about 60 seconds or more to remove the DEHT.

In still further embodiments, the device processing apparatuses may further include a pressure control part for maintaining an inner pressure of the process chamber to an atmospheric pressure or a pressure that is less than the atmospheric pressure when the preheating is performed.

In even further embodiments, the device processing apparatuses may further include a supply (e.g., bubbler or delivery) part for supplying nitrogen or nitrogen containing formic acid vapor into the process chamber when the preheating is performed.

In yet further embodiments, the supply part may supply the formic acid vapor into the process chamber after the preheating, and the heater may heat the first and second devices at a fourth temperature that is greater than the first temperature to remove impurities formed on a surface of the bonding material.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

In the following description, the technical terms are used only for explaining a specific exemplary embodiment while not limiting the present invention. The terms of a singular form may include plural forms unless specifically mentioned. The meaning of 'comprises' and/or 'comprising' specifies a composition, a component, a constituent, a stop, an operation and/or an element does not exclude other compositions, components, constituents, steps, operations and/or elements. In the specification, 'and/or' means that it includes at least one of listed components.

In semiconductor packaging according to the embodiments of the present invention, bis(2-ethylhexyl) terephthalate (DEHT) instead of typical flux that has been used for bonding devices to each other is used to perform the packaging. The DEHT may be a chemical additive that is used as a plasticizer when plastic molding is performed, particularly, may be a material that is used for softening polyvinyl chloride (PVC). In the embodiments of the present invention, the DEHT may be utilized in the semiconductor packaging to solve various limitations that occur by using the typical flux and simplify a production process, thereby reducing manufacturing costs.

Hereinafter, exemplary embodiments of the present invention will be described in detail with reference to the accompanying drawings.

Figure 1:
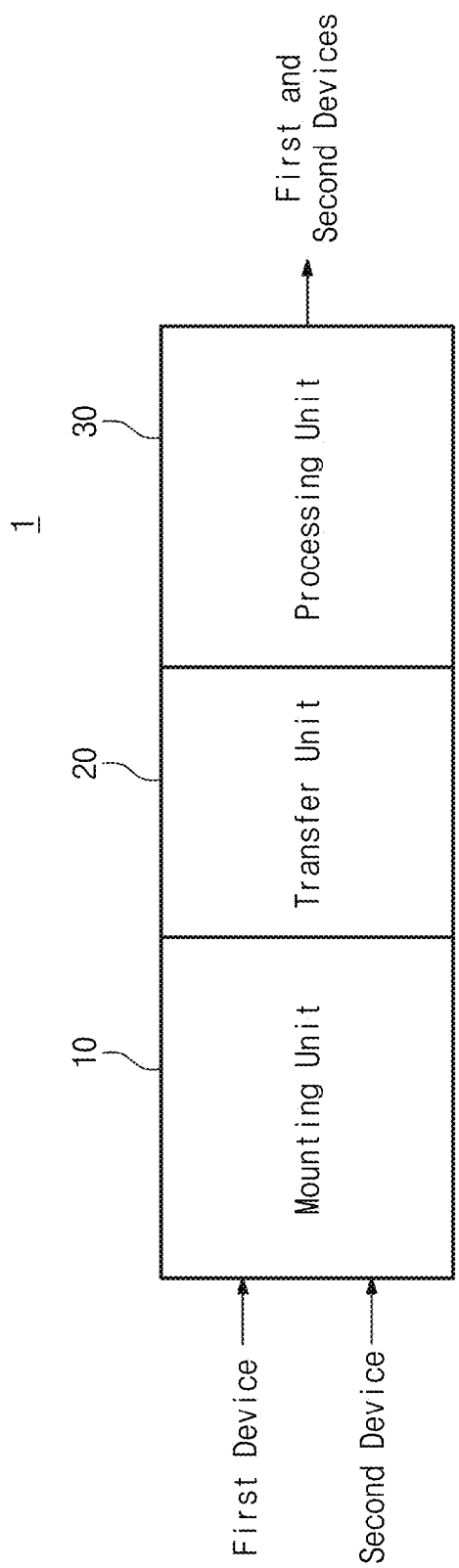
FIG. 1 is a schematic view of a device packaging facility according to an embodiment of the present invention.

FIG. 1 is a schematic view of a device packaging facility 1 according to an embodiment of the present invention.

Referring to FIG. 1, the device packaging facility 1 may be a facility in which at least two devices are bonded to each other to perform semiconductor packaging. The device packaging facility 1 may include a mounting unit 10, a processing unit 20, and a transfer unit 30.

The mounting unit 10 may provide DEHT between first and second devices to bond the first and second devices to each other. The processing unit 20 may thermally process the first and second devices that are bonded to each other to remove the DEHT and fix the first and second device to each other. The transfer unit 30 may transfer the first and second devices that are bonded to each other from the mounting unit 10 to the processing unit 20.

The first device may be a mounted object that is mounted on the second device and bonded to the second device. For example, the first device may include at least one of a solder ball, a semiconductor chip, a substrate, but is not limited thereto. Also, the second device may be a mounting object on which the first device is mounted. For example, the second device may include at least one of a semiconductor chip and a substrate, but is not limited thereto. That is to say, the first and second devices may be any objects that are bonded and fixed to each other in the semiconductor packaging.

According to the embodiment of the present invention, the DEHT can be used with at least one of DMP and DIBP. In this case, materials that can be used to attach the first device and the second device are mixtures of DEHT and DMP, or mixtures of DEHT and DIBP, or mixtures of DEHT, DMP, and DIBP.

The mounting unit 10 may provide the DEHT between the first and second devices to perform a device mounting process of bonding the first and second devices to each other.

According to the embodiment of the prevent invention, the mounting unit 10 may immerse a protruding portion of the first device in the DEHT to apply the DEHT to the protruding portion, and move at least one of the first and second devices to allow the protruding portion to contact the second device.

Figure 2:
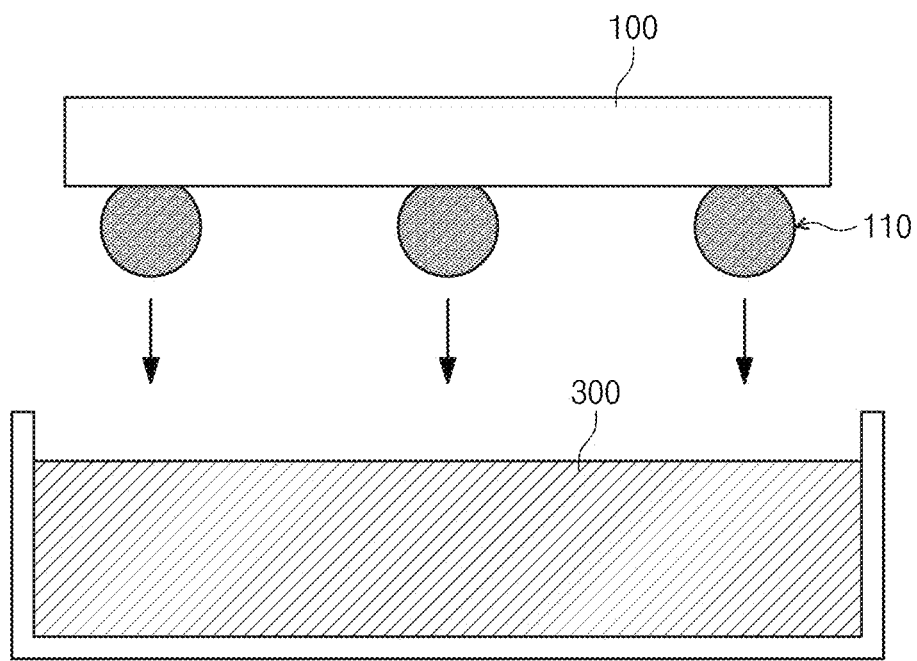
FIGS. 2 to 4 are views for explaining a process of mounting a device according to an embodiment of the present invention.
Figure 3:
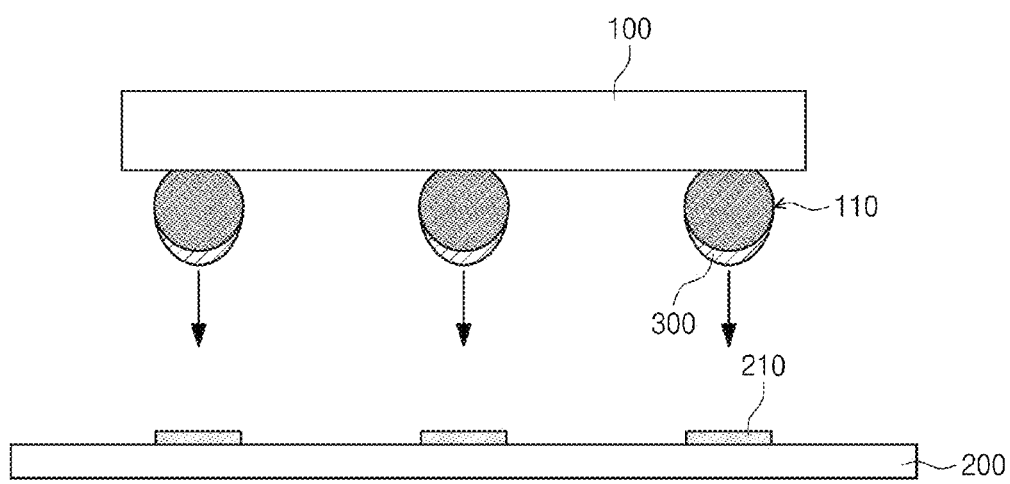
Figure 4:
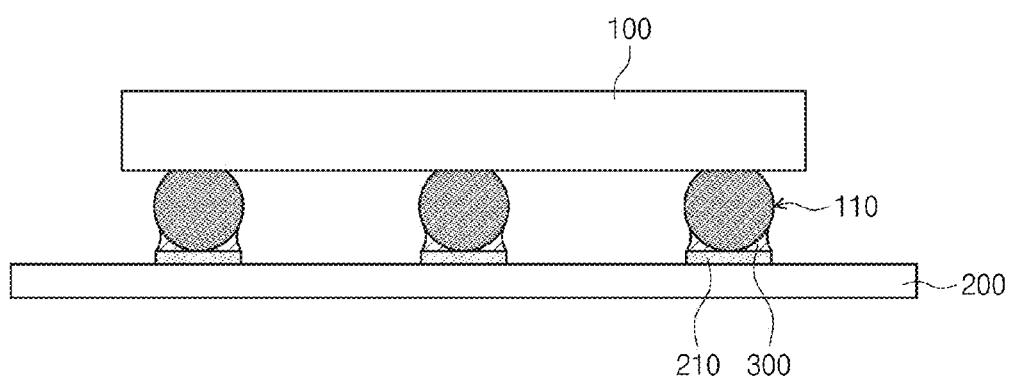

FIGS. 2 to 4 are views for explaining a process of mounting a device according to an embodiment of the present invention.

Referring to FIG. 2, the mounting unit 10 may immerse a protruding portion 110 of the first device 100 in DEHT 300 to apply the DEHT 300 to the protruding portion 110. To apply the DEHT 300 to the protruding portion 110 of the first device 100 as described above, the mounting unit 10 may include an elevation device for lifting the first device 100.

Then, referring to FIGS. 3 and 4, the mounting unit 10 may move at least one of the first and second devices 100 and 200 to allow the protruding portion 110 coated with the DEHT 300 to contact a pad 210 disposed on the second device 200.

Although the mounting unit 10 moves the first device 100 toward the second device 200 to allow the protruding portion 110 to contact the pad 210 of the second device 200 in the embodiment illustrated in FIG. 3, the present invention is not limited thereto. For example, the mounting unit 100 may move the second device 200 toward the first device 100 to allow the protruding portion 110 to contact the pad 210. Alternatively, the mounting unit 100 may move both of the first and second devices 100 and 200 to allow the protruding portion 110 to contact the pad 210. In this case, the mounting unit 10 may include an elevation device for lifting the second device 200.

According to another embodiment of the present invention, a mounting unit 10 may apply DEHT 300 to at least one of first and second devices 100 and 200 to move at least one of the first and second devices 100 and 200 so that the first and second devices 100 and 200 contact each other on the DEHT 300.

Figure 5:
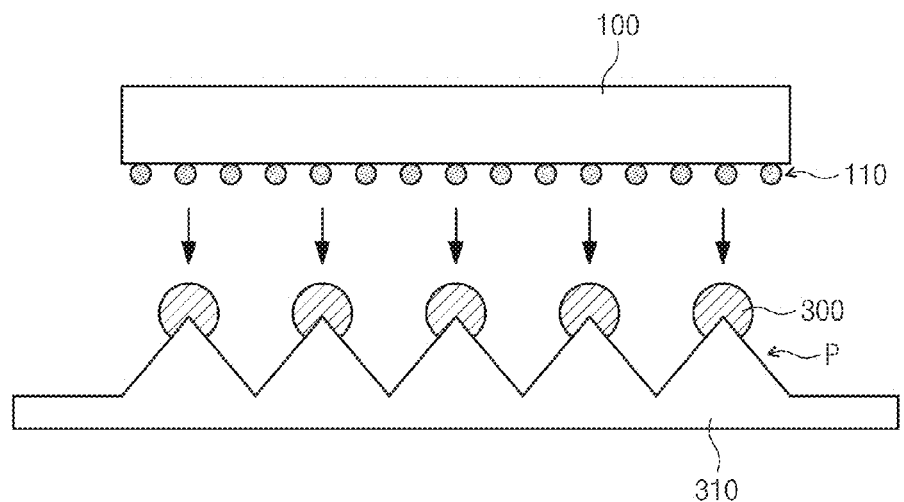
FIGS. 5 to 7 are views for explaining a process of mounting a device according to another embodiment of the present invention.
Figure 6:
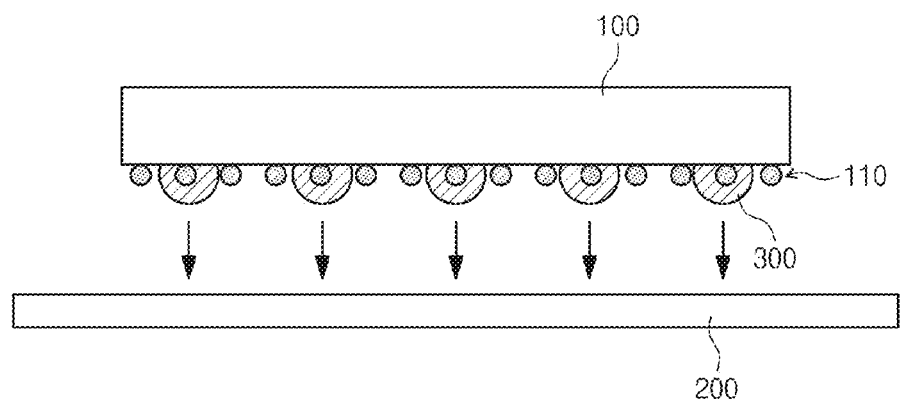
Figure 7:
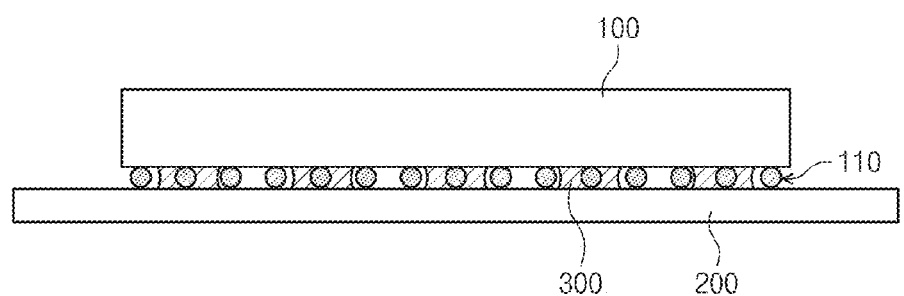

FIGS. 5 to 7 are views for explaining a process of mounting a device according to another embodiment of the present invention.

Referring to FIG. 5, the mounting unit 10 may use applicator 310 to apply DEHT 300 to the first device 100. As Illustrated in FIG. 5, the mounting applicator 310 including protrusion (P), which protrude to predetermined height, may smear DEHT 300 to at the end of a mounting protrusion (P).

The mounting unit 10 may move the first device 100 to apply DEHT 300 to the first device 100. Although, in FIG. 5 the mounting unit 10 moves the first device 100 toward the applicator 310 to apply DEHT, according to an embodiment of the present invention, the mounting unit 10 may move the applicator 310 rather than the first device 100 for applying DEHT, or may move the both the first device 100 and the applicator 310. Then, referring to FIGS. 6 and 7, the mounting unit 10 may move at least one of the first and second devices so that the first and the second devices may contact each other at the portion of the first device, where DEHT 300 was applied.

Although in FIG. 6 the mounting unit 10 has moved the first device 100 toward the second device 200 to contact the first and second devices 100 and 200, according to an embodiment of the present invention, the mounting unit 10 could move the second device 200 toward the first device 100 to make a contact, or could move the both the first and second devices 100 and 200 to make a contact.

Figure 8:
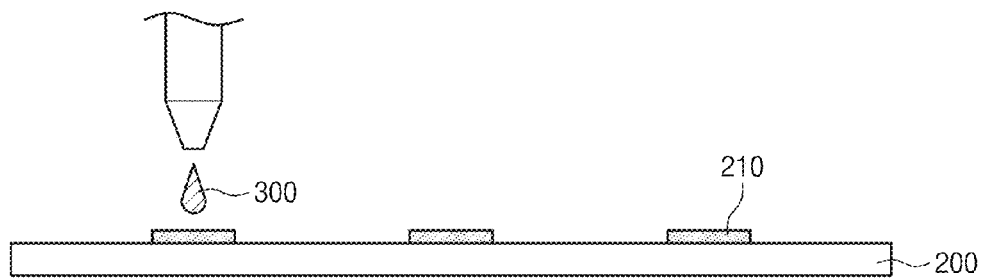
FIGS. 8 to 10 are views for explaining a process of mounting a device according to another embodiment of the present invention.
Figure 9:
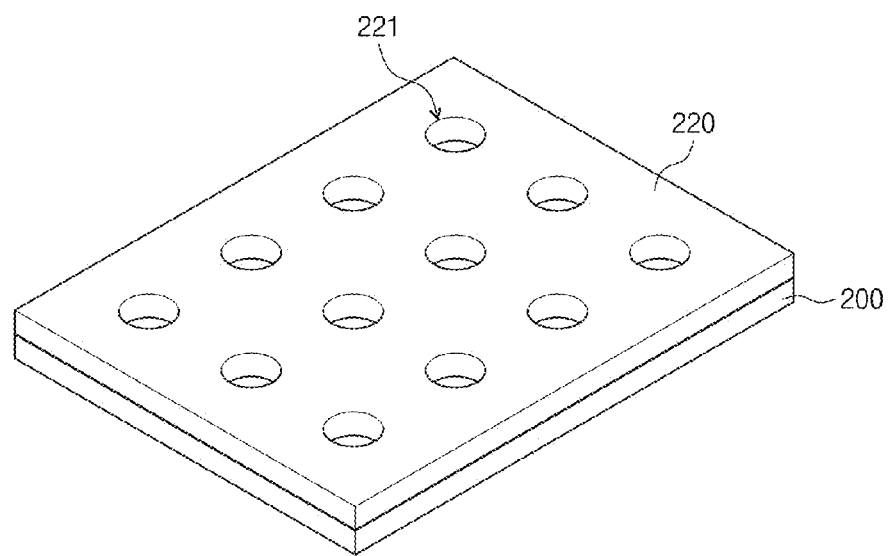
Figure 10:
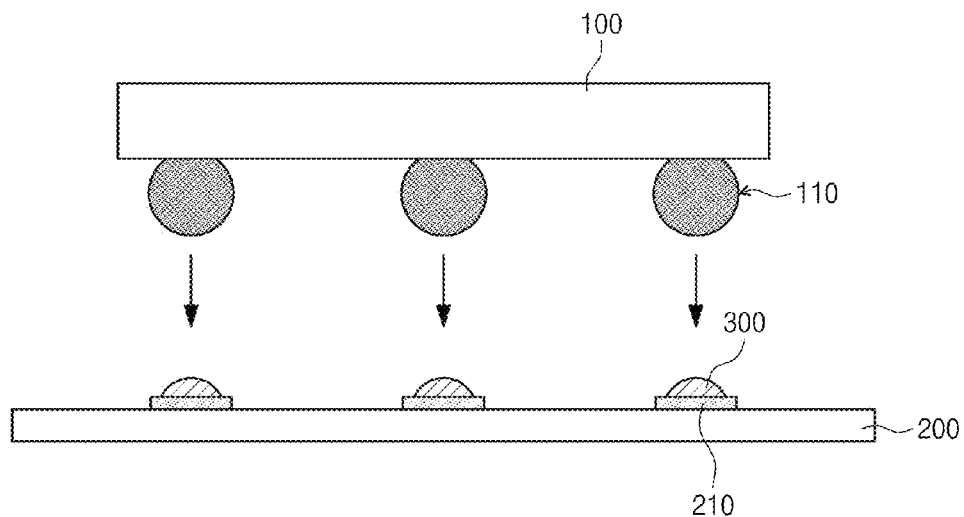

FIGS. 8 to 10 are views for explaining a process of mounting a device according to another embodiment of the present invention.

Referring to FIG. 8, a mounting unit 100 may apply DEHT 300 to at least one of first and second devices 100 and 200. Although the mounting unit 10 applies the DEHT 300 to a pad 210 of the second device 200 in the embodiment illustrated in FIG. 8, the present invention is not limited thereto. For example, the mounting unit 10 may apply the DEHT 300 to a contact portion of the first device 100. Also, according to embodiments, the DEHT 300 may be applied to both of contact portions of the first and second devices 100 and 200.

As illustrated in FIG. 8, the mounting unit 10 may apply the DEHT 300 to the contact portion of the second device 200 in a manner in which a liquid drop of the DEHT 300 is dropped onto the contact portion of the second device 200. However, as illustrated in FIG. 9, the mounting unit 10 may attach a stencil 220 having a hole 221 to the second device 200. The DEHT 300 is spread evenly on the stencil 220, thereby applying the DEHT 300 to the second device 200. According to the present embodiment, the hole 221 punched in the stencil 220 may be defined in a position that corresponds to the contact portion of the second device 200, e.g., the pad 210.

Then, referring to FIG. 10, the mounting unit 10 may move at least one of the first and second devices 100 and 200 to allow the first and second devices 100 and 200 to contact each other on the portion that is coated with the DEHT 300.

As above-described with reference to FIG. 3, to allow the first and second devices 100 and 200 to contact each other, the mounting unit 10 may move only the first device 100 or only the second device 100, or may move both of the first and second devices 100 and 200.

According to further another embodiment of the present invention, a mounting unit 10 may apply a film formed of DEHT 300 to at least one of first and second devices 100 and 200 to move at least one of the first and second devices 100 and 200 so that the first and second devices 100 and 200 contact each other on the portion to which the film is applied.

Figure 11:
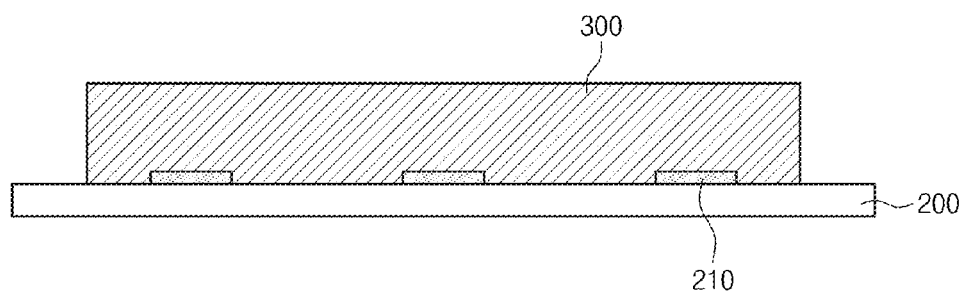
FIGS. 11 to 13 are views for explaining a process of mounting a device according to further another embodiment of the present invention.
Figure 12:
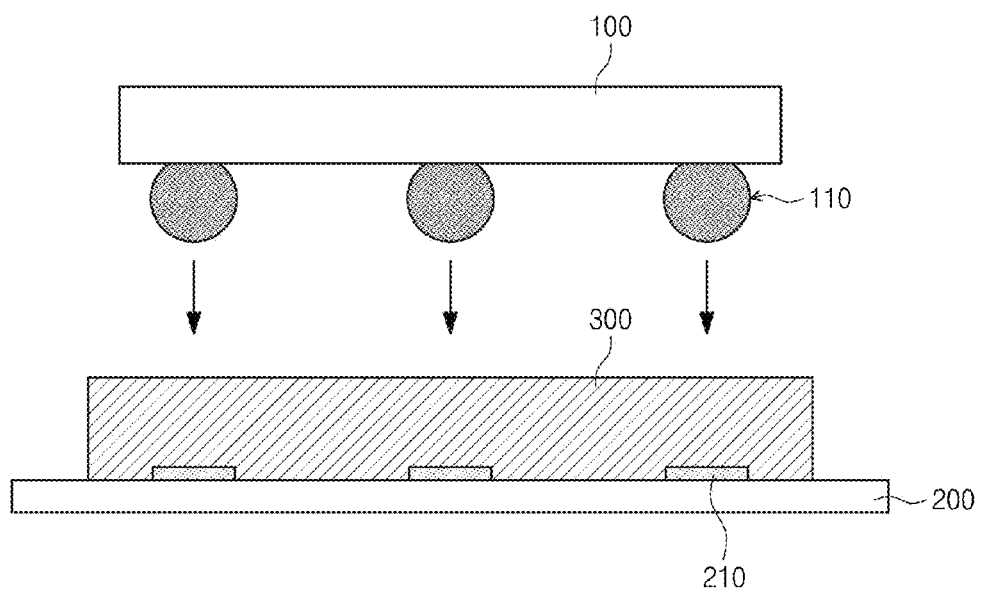
Figure 13:
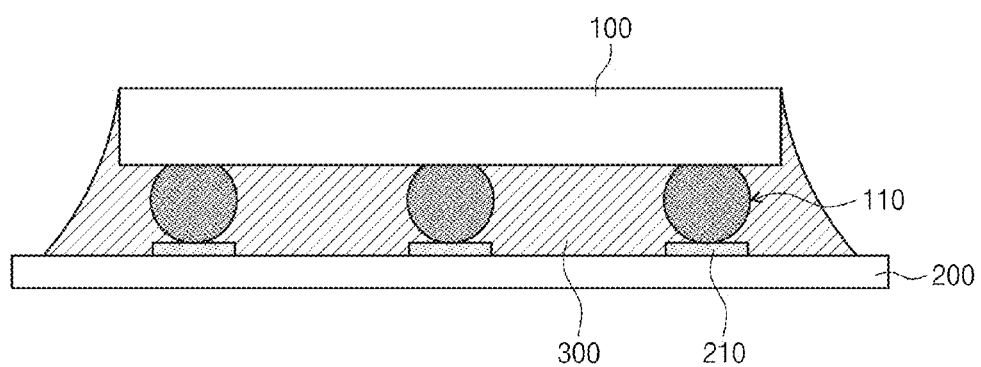

FIGS. 11 to 13 are views for explaining a process of mounting a device according to further another embodiment of the present invention.

Referring to FIG. 11, a mounting unit 10 may apply a film 300 formed of DEHT 300 to at least one of first and second devices 100 and 200. For example, as illustrated in FIG. 11, the mounting unit 10 may apply a film formed of DEHT 300 to a surface on which a pad 210 is disposed on the second device 200. For this, the mounting unit 10 may including a driving unit that moves the film toward the second device 200 to press the film onto the surface to which the film is applied.

Then, referring to FIG. 12, the mounting unit 10 may move at least one of the first and second devices 100 and 200 to allow the first and second devices 100 and 200 to contact each other on the portion to which the film is applied.

Similarly, to allow the first and second devices 100 and 200 to contact each other, the mounting unit 10 may move only the first device 100 or only the second device 100, or may move both of the first and second devices 100 and 200.

As a result, as illustrated in FIG. 13, a space between the first and second devices 100 and 20 may be filled with the DEHT 300. Here, the whole space may be filled with the DEHT 300, or only a portion of the space may be filled with the DEHT 300.

According to further another embodiment of the present invention, a mounting unit 10 may allow first and second devices 100 and 200 to contact each other and provide DEHT 300 on an edge of a contact portion between the first and second devices 100 and 200 to allow the DEHT 300 to be absorbed, stuck or wicked onto a boundary between the first and second devices 100 and 200.

Figure 14:
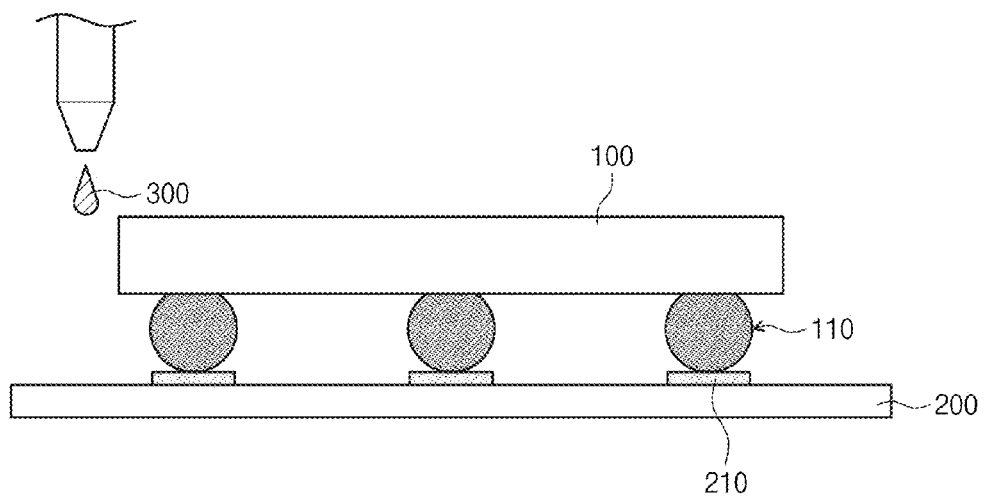
FIGS. 14 to 15 are views for explaining a process of mounting a device according to further another embodiment of the present invention.
Figure 15:
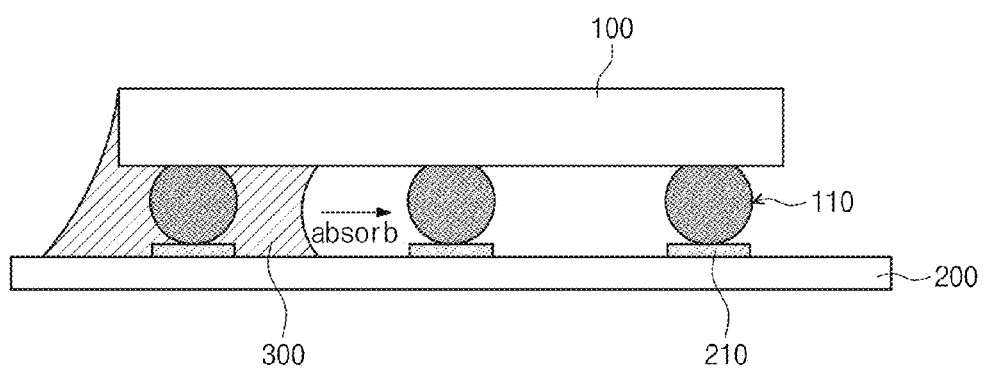

FIGS. 14 to 15 are views for explaining a process of mounting a device according to further another embodiment of the present invention.

According to an embodiment, the mounting unit 10 may contact the first and second devices 100 and 200 with each other and then provide the DEHT 300 on the contact portion between the first and second devices 100 and 200.

For example, the mounting unit 10 may drop a liquid drop of the DEHT 300 onto an edge of the contact portion between the first and second devices 100 and 200 to provide the DEHT 300 on the contact portion. According to embodiments, the DEHT 300 may be provided to a plurality of points on the edge of the contact portion.

As a result, as illustrated in FIG. 15, since the DEHT 300 is absorbed onto a boundary between the first and second devices 100 and 200 by a capillary phenomenon, the DEHT 300 may be filled into the whole or a portion of a space between the first and second devices 100 and 200.

The transfer unit 20 may transfer the first and second devices 100 and 200 that are attached to each other through the above-described mounting process to the processing unit 30. The transfer unit 20 may include a robot or conveyor that is disposed between the mounting unit 10 and the processing unit 30 to carry the first and second devices 100 and 200, but the present invention is not limited thereto. For example, a device for transferring the devices may be variously realized according to embodiments.

The processing unit 30 may process the transferred devices to remove the DEHT 300 and then fix the devices to each other, thereby completely the packaging process.

According to an embodiment of the present invention, the processing unit 30 may include a device processing apparatus that thermally processes the first and second devices 100 and 200 attached to each other by using the DEHT 300, to remove the DEHT 300 and then fix the first and second devices 100 and 200 to each other.

Figure 16:
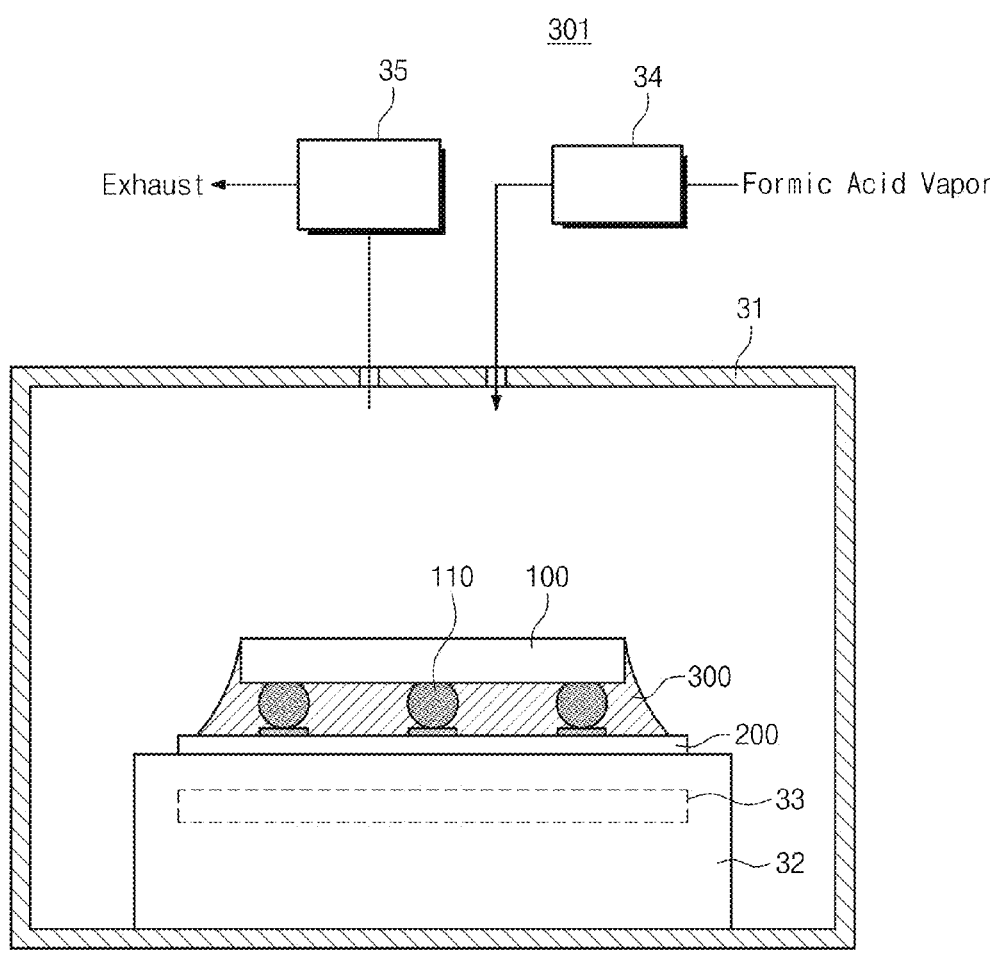
FIG. 16 is a view of a device processing apparatus according to an embodiment of the present invention.

FIG. 16 is a view of a device processing apparatus 301 according to an embodiment of the present invention.

Referring to FIG. 16, according to an embodiment, the device processing apparatus 301 may include a process chamber 31, a device support 32, and a heater 33.

The process chamber 31 may provide a space in which a device processing process is performed. The device support 32 may be disposed within the process chamber 31 to support the first and second devices 100 and 200 that are attached to each other. The heater 33 may heat the first and second devices 100 and 200 that are attached to each other.

According to an embodiment of the present invention, the processing unit 30 may preheat the first and second devices 100 and 200 that are attached to each other at a first temperature to remove DEHT 300, heat the first and second devices 100 and 200 at a second temperature that is greater than the first temperature to melt a bonding material disposed on a contact portion between the first and second devices 100 and 200, and cool the first and second devices 100 and 200 at a third temperature that is less than the second temperature to solidify the bonding material 110.

Figure 17:
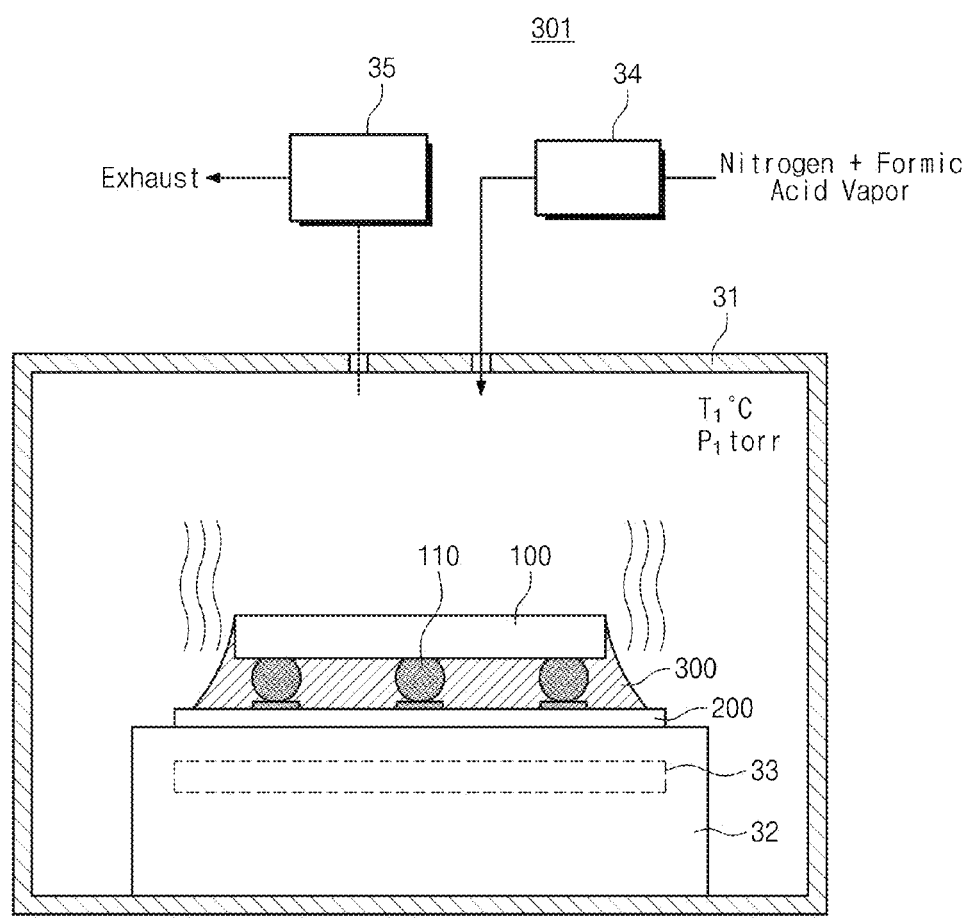
FIG. 17 is a view for explaining a process of removing DEHT according to an embodiment of the prevent invention.

FIG. 17 is a view for explaining a process of removing DEHT 300 according to an embodiment of the prevent invention.

Referring to FIG. 17, the processing unit 30 may preheat the devices at a first temperature T1 to remove DEHT 300 disposed between the devices before the devices are bonded to each other. For this, the heater 33 may preheat the first and second devices 100 and 200 that are attached to each other at the first temperature T1.

According to the present embodiment, the first temperature T1 may be lower than a boiling point of the DEHT 300.

Particularly, the heater 33 may preheat the first and second devices 100 and 200 that are attached to each other at a temperature of about 180° C. to about 220° C. to remove the DEHT 300. In this case, the heater 33 may preheat the first and second devices 100 and 200 that are attached to each other at a temperature of about 180° C. to about 220° C. for about 60 seconds or more.

According to an embodiment of the present invention, when the preheating for removing the DEHT 300 is performed, an inner pressure P1 of the process chamber 31 may be maintained to the atmospheric pressure or a pressure that is less than the atmospheric pressure. For this, the device processing apparatus 301 may include a pressure control part 35 for controlling the inner pressure of the process chamber 31. The pressure control part 35 may control and maintain the inner pressure of the process chamber 31 to a predetermined pressure by using an exhaust unit such as a pump or compressor.

According to an embodiment of the present invention, when the preheating for removing the DEHT 300 is performed, dry nitrogen or nitrogen containing formic acid vapor may be supplied into the process chamber 31. For this, the device processing apparatus 301 may include a supply part 34 such as bubbler or acid vapor delivery for supplying a fluid required for the process into the process chamber 31. The fluid supply part 34 may supply the fluid from a storage container in which the fluid is stored into the process chamber 31 through a tube. Also, a flow rate control unit such as a valve may be disposed in the tube to control a flow rate of the supplied fluid.

According to an embodiment, the DEHT 300 provided to a boundary between the first and second devices 100 and 200 to bond the first and second devices 100 and 200 to each other may be phase-changed into a gas through the preheating and then be discharged out of the process camber 31. To remove the DEHT 300, a nitrogen gas or a mixed gas of nitrogen and formic acid may be used as the process fluid.

After the DEHT 300 is removed, the processing unit 30 may heat the first and second devices 100 and 200 at a second temperature that is greater than the first temperature T1 to melt a bonding material 110 disposed on a contact portion between the first and second devices 100 and 200 and then cool the first and second devices 100 and 200 at a third temperature that is less than the second temperature to solidify the bonding material 110.

Figure 18:
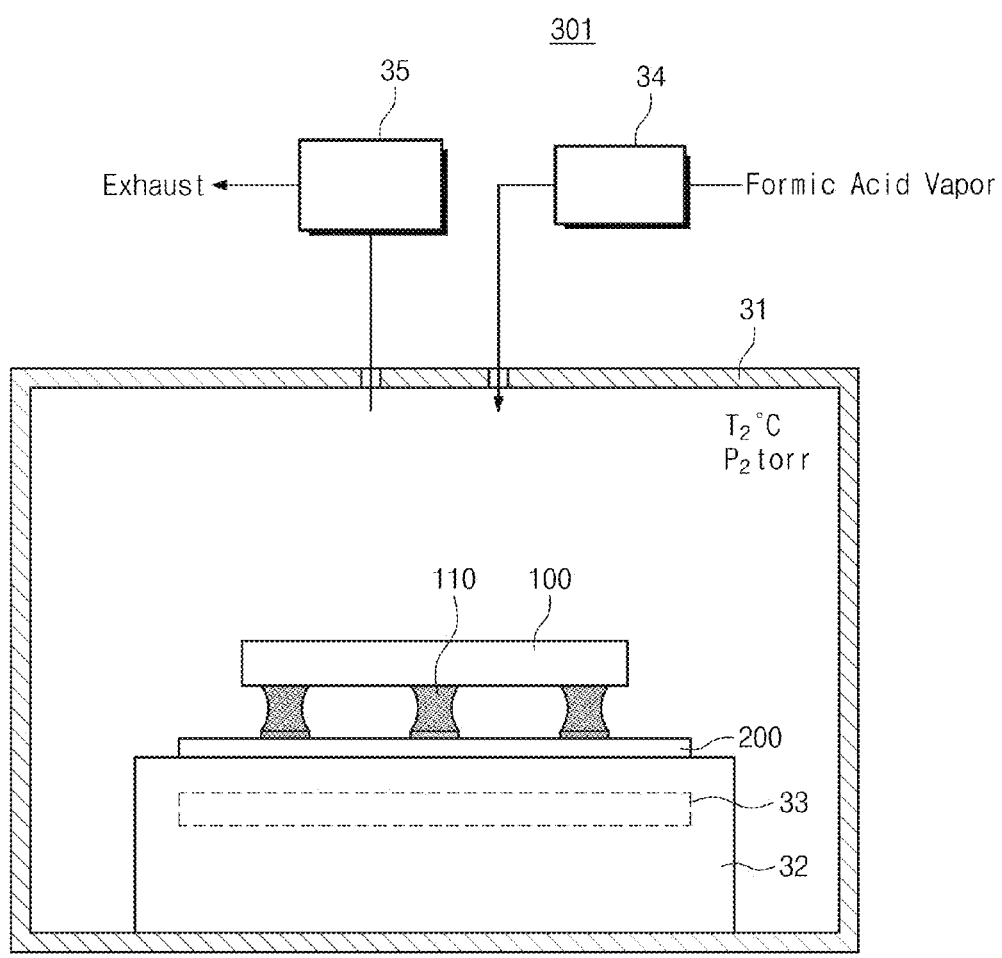
FIGS. 18 and 19 are views for explaining a process of bonding first and second devices to each other according to an embodiment of the prevent invention.
Figure 19:
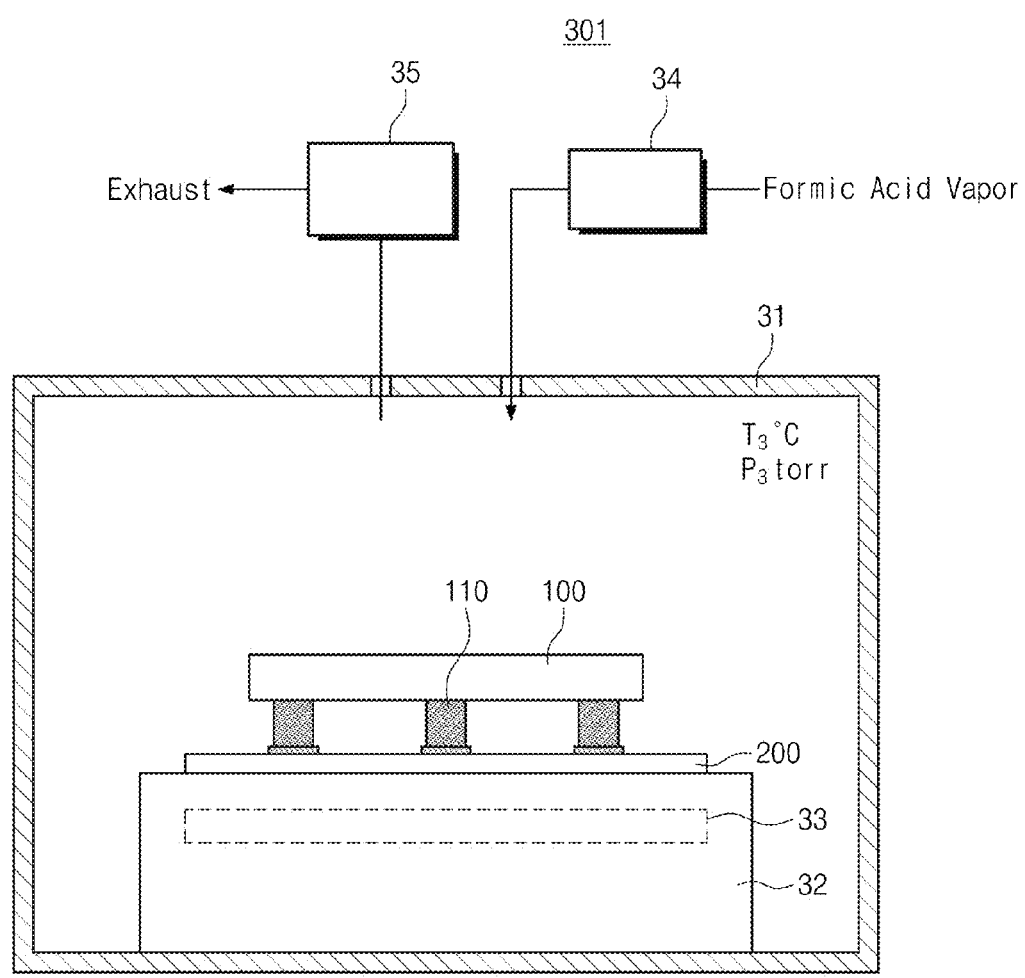

FIGS. 18 and 19 are views for explaining a process of bonding first and second devices 100 and 200 to each other according to an embodiment of the prevent invention.

Referring to FIG. 18, the processing unit 30 may heat the first and second devices 100 and 200 from which the DEHT 300 is removed at a second temperature T2 that is greater than the first temperature T1 to melt the bonding material 110 disposed on the contact portion between the first and second devices 100 and 200.

For this, the heater 33 may heat the first and second devices 100 and 200 at the second temperature T2. As a result, the bonding material 110 disposed between the first and second devices 100 and 200, for example, a solder bump may be melted to be formed on the boundary between the first and second devices 100 and 200.

Here, the supply part 34 may supply formic acid into the process chamber 31. Also, the pressure control part 35 may maintain an inner pressure P1 of the process chamber 31 to the atmospheric pressure or a pressure that is less than the atmospheric pressure.

Then, referring to FIG. 19, the processing unit 30 may cool the first and second devices 100 and 200 at a third temperature T3 that is less than the second temperature T2 to solidify the bonding material 110. As a result, the first and second devices 100 and 200 may be fixed and bonded to each other by the bonding material 110.

Here, the second temperature T2 is greater than or equal to the melting point of the bonding material 110, and the third temperature T3 may be less than the melting point of the bonding material 110. The second temperature T2 and the third temperature T3 may vary according to kinds of bonding materials 110. The bonding material 110 may include different kinds of metal, metal alloy, resin containing metal, and the like in addition to the solder as described above.

According to another embodiment of the present invention, the processing unit 30 may heat the first and second devices 100 and 200 at a fourth temperature that is less than the first temperature under the atmospheric pressure or a pressure that is less than the atmospheric pressure while exposing the first and second devices 100 and 200 to formic acid vapor after removing the DEHT 300 to remove impurities formed on a surface of the bonding material 110.

Figure 20:
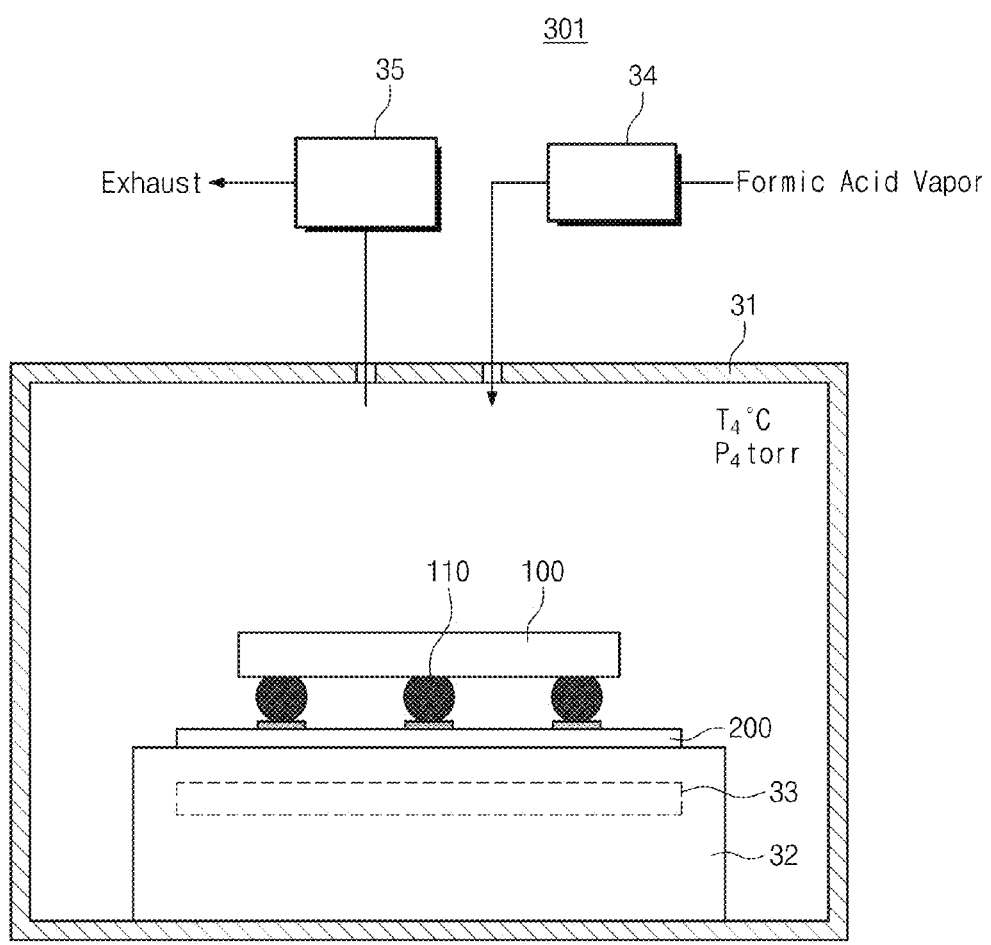
FIG. 20 is a view for explaining a process of removing impurities remaining on a bonding material after DEHT is removed according to another embodiment of the present invention.

FIG. 20 is a view for explaining a process of removing impurities remaining on a bonding material 110 after DEHT is removed according to another embodiment of the present invention.

Referring to FIG. 20, the processing unit 30 may thermally process the first and second devices 100 and 200 at a fourth temperature T4 to additionally perform a process of removing impurities formed on a surface of the bonding material 110 before melting the bonding material 110 after performing preheating to remove DEHT 300 between the first and second devices 100 and 200.

For this, the heater 330 may heat the first and second devices 100 and 200 at the fourth temperature T4 that is greater than the first temperature T1. Also, the fluid supply part 34 may supply formic acid into the process chamber 31. According to embodiments, the fluid supply part 34 may supply nitrogen containing formic acid vapor. Also, the pressure control part 35 may maintain an inner pressure P4 of the process chamber 31 to the atmospheric pressure or a pressure that is less than the atmospheric pressure.

The impurities may be materials formed on a surface of the bonding material 110. Also, when the impurities are melted together with the bonding material 110 and then are included in the bonding portion between the first and second devices 100 and 200, the impurities may be materials that deteriorate performance of the devices. For example, when the bonding material 110 is metal, the impurities may be metal oxide.

As described above, the first and second devices 100 and 200 that are fixed to each other through the removal of the DEHT 300 and the melting and solidifying of the bonding material 110 may take out of the device packaging facility to complete the packaging process.

That is to say, unlike the typical packaging process using flux for bonding devices to each other, in the packaging process using the DEHT according to the embodiments of the present invention, the bonding material may be preheated to remove the DEHT before the bonding material is melted. Thus, it is unnecessary to perform separate cleaning and drying processes.

As a result, in the packaging process according to the embodiment of the present invention, the process number may be reduced, the production process may be simplified, and the manufacturing costs may be reduced when compared to those of the typical packaging process.

As described above, the packaged devices may be directly transferred into an inspection facility for the inspection without performing the cleaning and drying processes.

Figure 21:
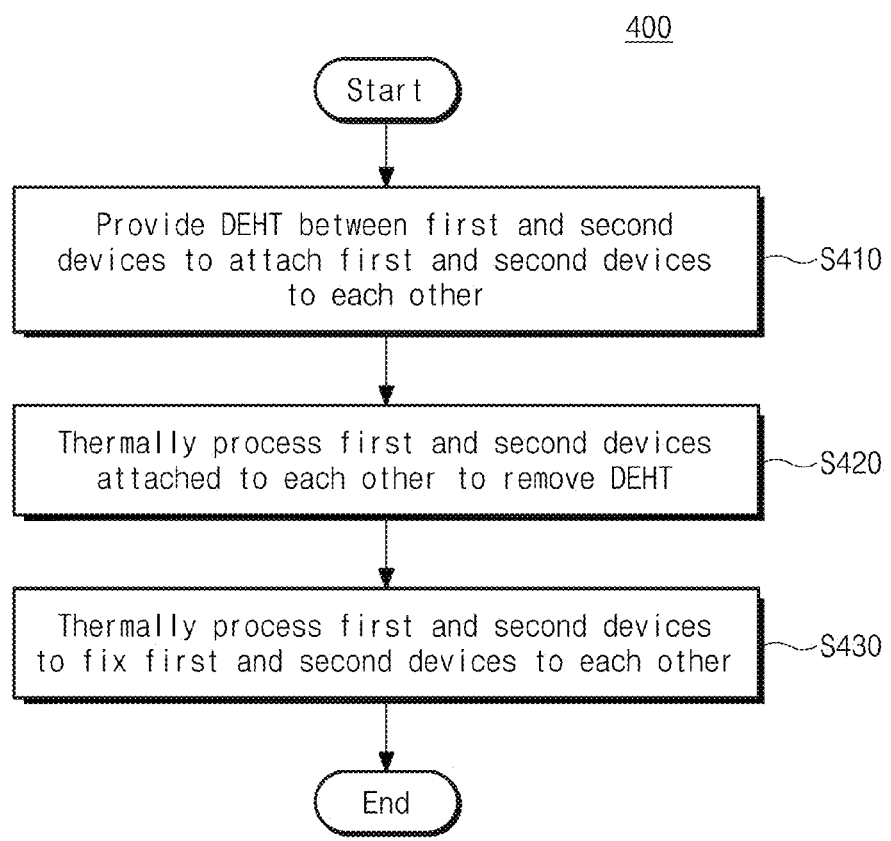
FIG. 21 is a flowchart illustrating a device packaging process according to an embodiment of the present invention.

FIG. 21 is a flowchart illustrating a device packaging process 400 according to an embodiment of the present invention.

The device packaging process 400 may be performed by the device packaging facility 1 according to the foregoing embodiments of the present invention.

Referring to FIG. 21, the device packaging process 400 may include a process (S410) of providing DEHT 300 between first and second devices 100 and 200 to attach the first and second devices 100 and 200 to each other, a process (S420) of thermally processing the first and second devices 100 and 200 that are attached to each other to remove the DEHT 300, and a process (S430) of thermally processing the first and second devices 100 and 200 to fix the first and second devices 100 and 200 to each other.

The first device 100 may include at least one of a solder ball, a semiconductor chip, and a substrate, but is not limited thereto. The second device 200 may include at least one of a semiconductor chip and a substrate, but is not limited thereto.

The DEHT 300 may be used at least one of DMP and DIBP. In this case, the materials that could be used to attach the first and second devices 100 and 200 are mixtures of DEHT and DMP, or mixtures of DEHT and DIBP, or mixtures of DEHT, DMP, and DIBP.

Figure 22:
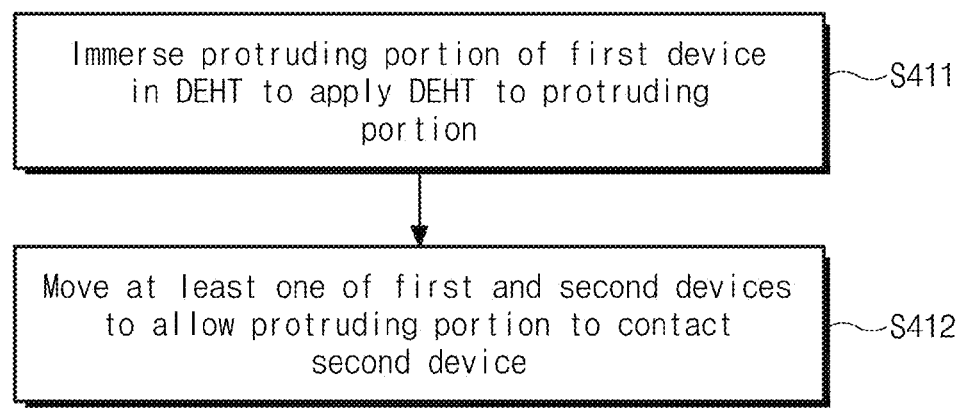
FIG. 22 is a flowchart for explaining a process of mounting a device according to an embodiment of the present invention.

FIG. 22 is a flowchart for explaining a process of mounting a device according to an embodiment of the present invention.

Referring to FIG. 22, according to an embodiment of the present invention, the process (S410) of attaching the first and second devices 100 and 200 to each other may include a process (S411) of immersing a protruding portion 110 of the first device 100 in the DEHT 300 to apply the DEHT 300 to the protruding portion 110 and a process (412) of moving at least one of the first and second devices 100 and 200 to allow the protruding portion 110 to contact the second device 200.

Figure 23:
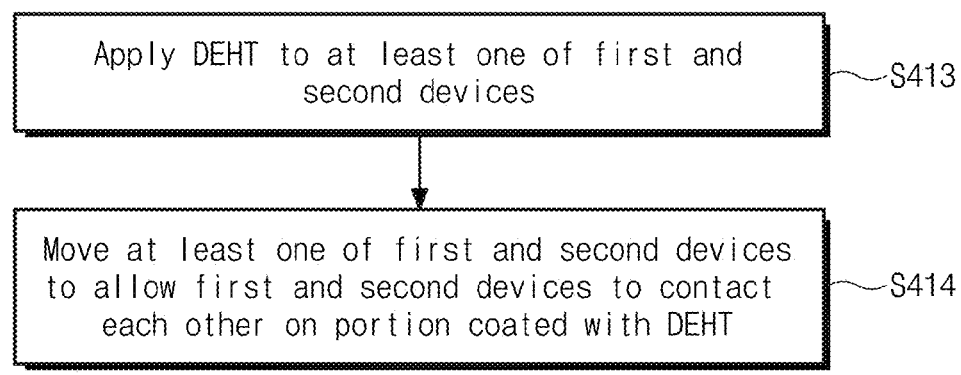
FIG. 23 is a flowchart for explaining a process of mounting a device according to another embodiment of the present invention.

FIG. 23 is a flowchart for explaining a process of mounting a device according to another embodiment of the present invention.

Referring to FIG. 23, according to another embodiment of the present invention, the process (S410) of attaching the first and second devices 100 and 200 to each other may include a process (S413) of applying the DEHT 300 to at least one of the first and second devices 100 and 200 and a process (S414) of moving at least one of the first and second devices 100 and 200 to allow the first and second devices 100 and 200 to contact each other on the portion coated with the DEHT 300.

Figure 24:
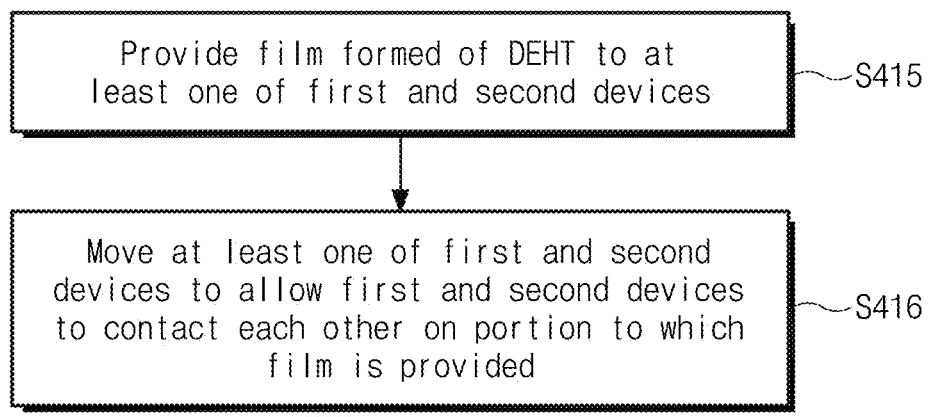
FIG. 24 is a flowchart for explaining a process of mounting a device according to further another embodiment of the present invention.

FIG. 24 is a flowchart for explaining a process of mounting a device according to further another embodiment of the present invention.

Referring to FIG. 24, according to further another embodiment of the present invention, the process (S410) of attaching the first and second devices 100 and 200 to each other may include a process (S415) of providing a film formed of the DEHT 300 to at least one of the first and second devices 100 and 200 and a process (S416) of moving at least one of the first and second devices 100 and 200 to allow the first and second devices 100 and 200 to contact each other on the portion to which the film is provided.

Figure 25:
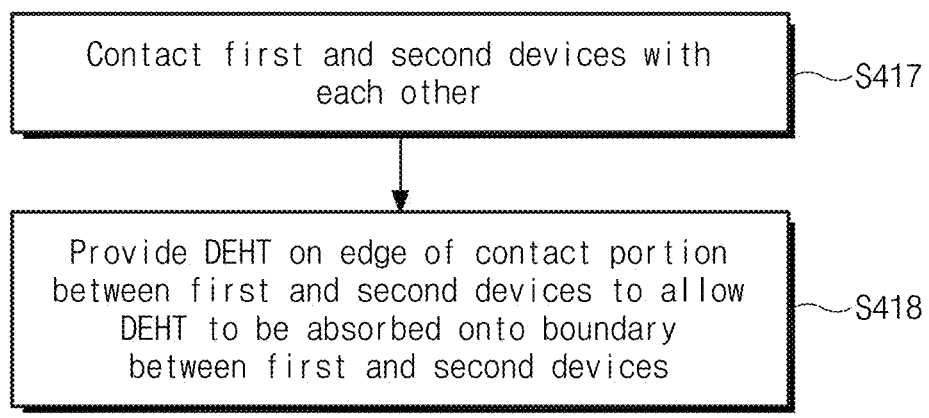
FIG. 25 is a flowchart for explaining a process of mounting a device according to further another embodiment of the present invention.

FIG. 25 is a flowchart for explaining a process of mounting a device according to further another embodiment of the present invention.

Referring to FIG. 25, according to further embodiment of the present invention, the process (S410) of attaching the first and second devices 100 and 200 to each other may include a process (S417) of allowing the first and second devices 100 and 200 to contact each other and a process (S418) of providing the DEHT 300 to an edge of the contact portion between the first and second devices 100 and 200 to allow the DEHT 300 to be absorbed onto a boundary between the first and second devices 100 and 200.

According to an embodiment of the present invention, the process (S420) of removing the DEHT 300 may include a process of preheating the first and second devices 100 and 200 that are attached to each other at a first temperature T1 to remove the DEHT 300.

According to an embodiment of the present invention, the process (S430) of fixing the first and second devices 100 and 200 to each other may include a process of heating the first and second devices 100 and 200 at a second temperature T2 that is greater than the first temperature T1 to melt a bonding material 110 disposed on the contact portion between the first and second devices 100 and 200 and a process of cooling the first and second devices 100 and 200 at a third temperature T3 that is less than the second temperature T2 to solidify the bonding material 110.

The first temperature T1 may be lower than a boiling point of the DEHT 300.

The second temperature T2 is greater than or equal to the melting point of the bonding material 110, and the third temperature T3 may be less than the melting point of the bonding material 110.

According to an embodiment of the present invention, the process (S420) of removing the DEHT 300 may include a process of preheating the first and second devices 100 and 200 that are attached to each other at a temperature of about 180° C. to about 220° C.

According to an embodiment, the process of preheating the first and second devices 100 and 200 may include a process of preheating the first and second devices 100 and 200 at the temperature of about 180° C. to about 220° C. for about 60 seconds or more.

According to an embodiment of the present invention, the process (S420) of removing the DEHT 300 may include a process of preheating the first and second devices 100 and 200 that are attached to each other under the atmospheric pressure or a pressure that is less than the atmospheric pressure.

According to an embodiment of the present invention, the process (S420) of removing the DEHT 300 may include a process of preheating the first and second devices 100 and 200 that are attached to each other at the first temperature T1 while exposing the first and second devices 100 and 200 to nitrogen or nitrogen containing formic acid vapor.

According to an embodiment, the device packaging process 400 may further include a process of heating the first and second devices 100 and 200 at a fourth temperature T4 that is greater than the first temperature T1 under the atmospheric pressure or the pressure that is less than the atmospheric pressure while exposing the first and second devices 100 and 200 to nitrogen or nitrogen containing formic acid vapor to remove impurities formed on the surface of the bonding material 110 after the process (S42) of removing the DEHT 300.

The first and second devices that are fixed to each other through the above-described processes may be taken out of the device packaging facility 1 to complete the packaging. The packaged devices may be directly transferred into an inspection facility for the inspection without performing the cleaning and drying processes.

According to the embodiments of the present invention, the DEHT instead of the flux may be used in the packaging process to minimize the effects on the human body, equipment, and environments.

According to the embodiments of the present invention, the inspection may be directly performed without performing the cleaning and drying processes after the devices are bonded to each other to simplify the production process.

To confirm DEHT residues the inventor applied DEHT to a device then processed reflow according to an embodiment of the present invention.

Figure 26:
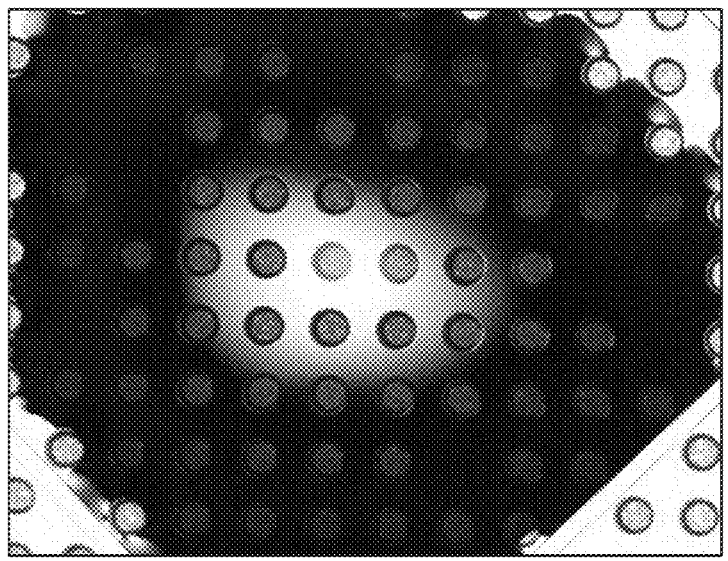
FIG. 26 is an image of a silicon wafer coupon that has copper pads after applying DEHT.

As shown in FIG. 26, couple drops of DEHT were applied on the silicon wafer coupon having copper pads and reflowed the silicon wafer coupon. More than required amounts of DEHT were applied on silicon wafer coupon for a device attachment.

Figure 27:
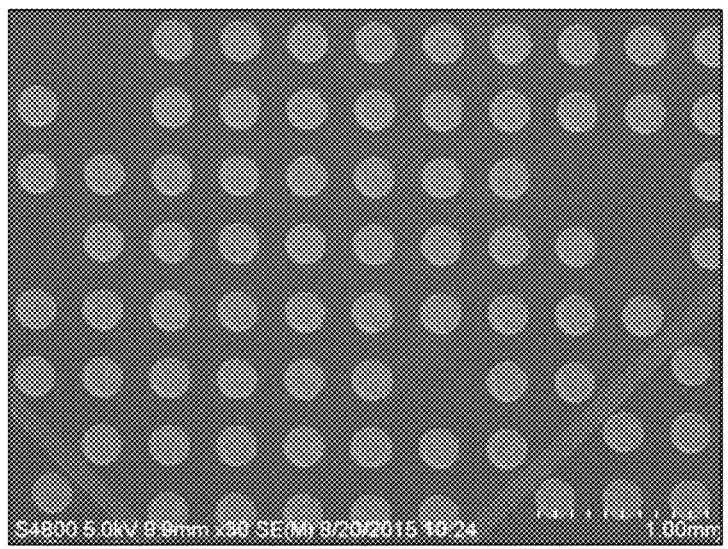
FIG. 27 is SEM image after reflowing silicon wafer coupon of FIG. 26.
Figure 28:
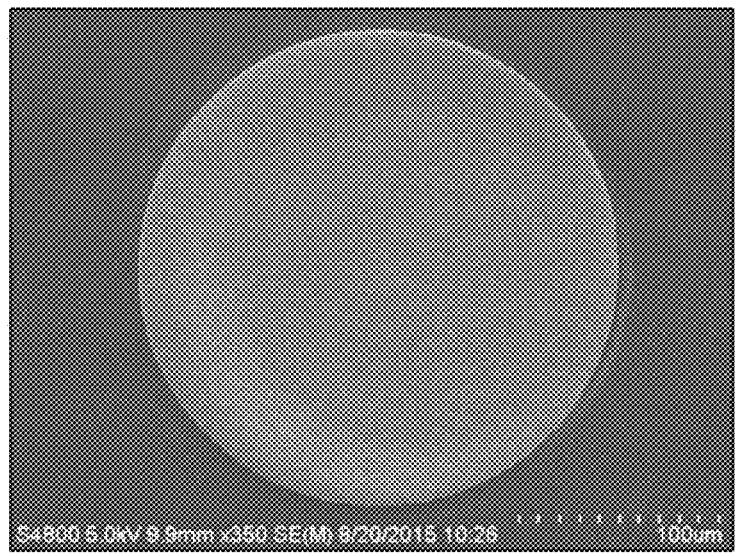
FIG. 28 is SEM image of copper pads after reflowing a silicon wafer coupon of FIG. 26.
Figure 29:
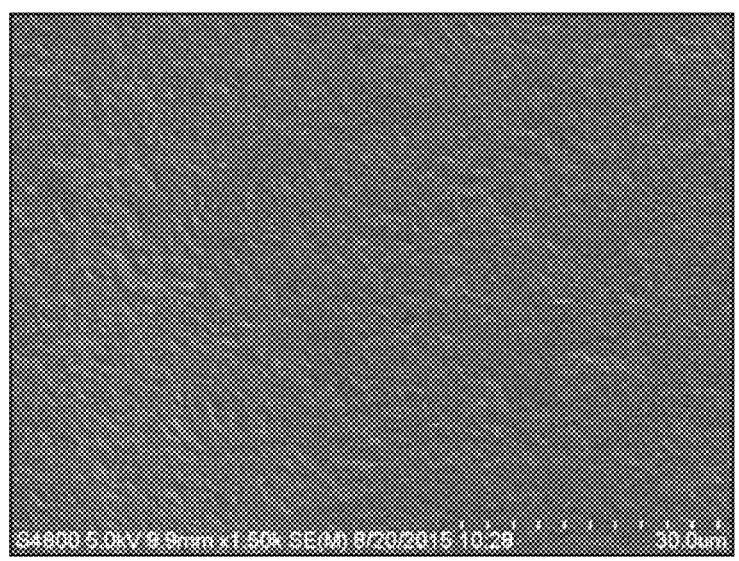
FIG. 29 is SEM image of side of copper pads after reflowing a silicon wafer coupon.

FIG. 27 is SEM image with 30× magnification of a silicon wafer coupon of FIG. 26 after reflow, and FIG. 28 is SEM image with 350× magnification of copper pads of FIG. 26 after reflowing a silicon wafer coupon, and FIG. 29 is SEM image with 1500× magnification of side of copper pads after reflowing a silicon wafer. And, FIG. 30 is SEM image with 1500× magnification of side of copper pads after reflowing a silicon wafer where DEHT was not applied.

Figure 30:
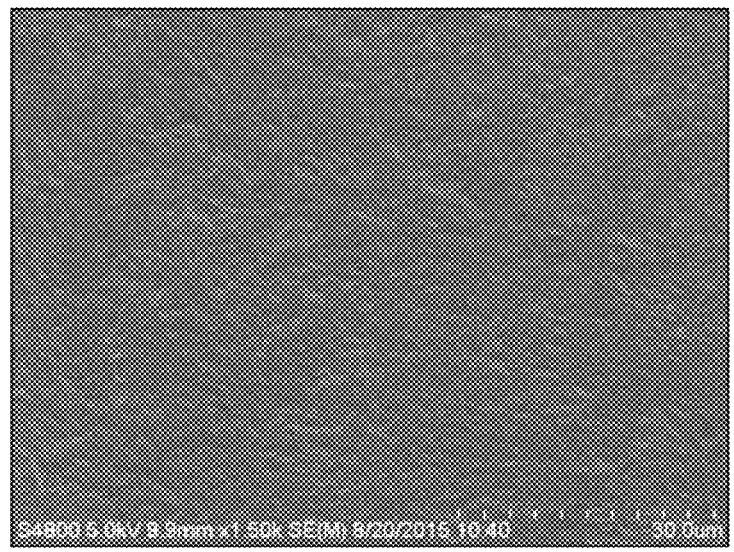
FIG. 30 is SEM image of side of copper pads after reflowing a silicon wafer coupon where DEHT was not applied.
Figure 31:
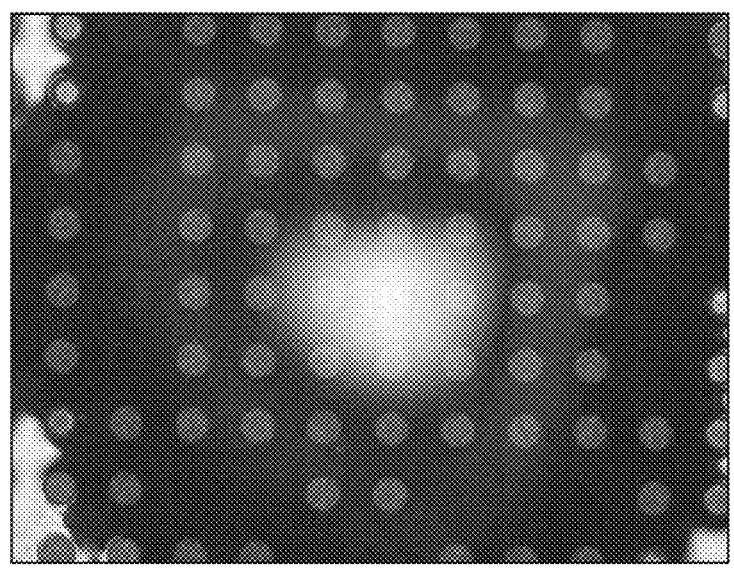
FIG. 31 is an image of polyimide PCB coupon having copper pads where DEHT was applied.

Comparing FIGS. 29 and 30, there is no difference between surface of copper pads where DEHT was applied after reflow and surface copper pads where DEHT was not applied after reflow Likewise FIG. 31, the inventor dropped few DEHT on the polyimide PCB coupon having copper pads then processed reflow. Also in this experiment, more than required amounts of DEHT were applied on PCB coupon for a device attachment.

Figure 32:
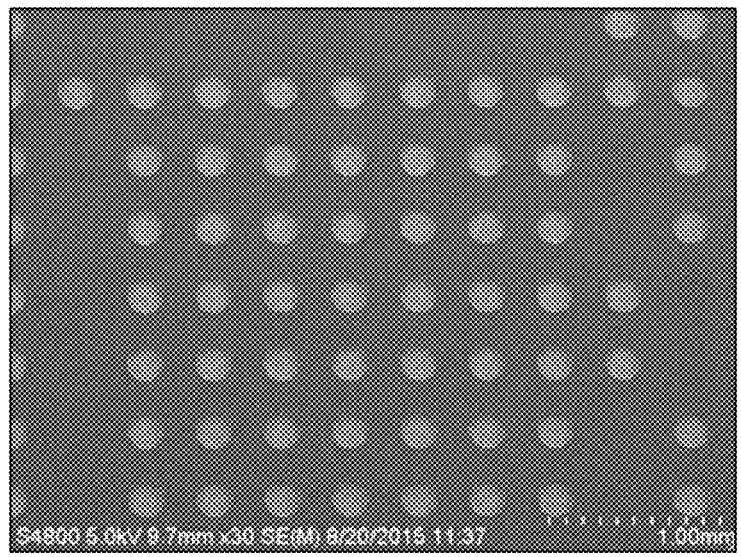
FIG. 32 is SEM image of PCB coupon of FIG. 31 after reflow.
Figure 33:
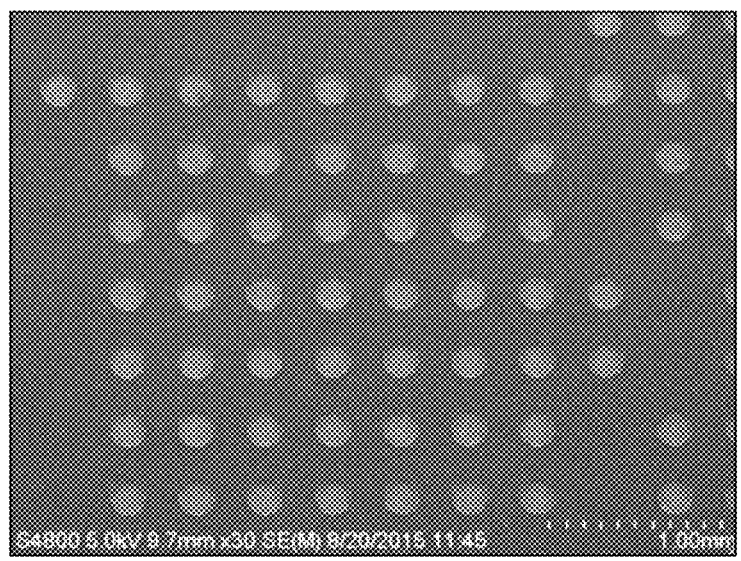
FIG. 33 is a SEM image after reflowing PCB coupon where DEHT was not applied.

FIG. 32 is SEM image with 30× magnification of PCB coupon of FIG. 31 after reflow, and FIG. 33 is SEM image with 30× magnification of PCB coupon after reflow where DEHT was not applied.

Figure 34:
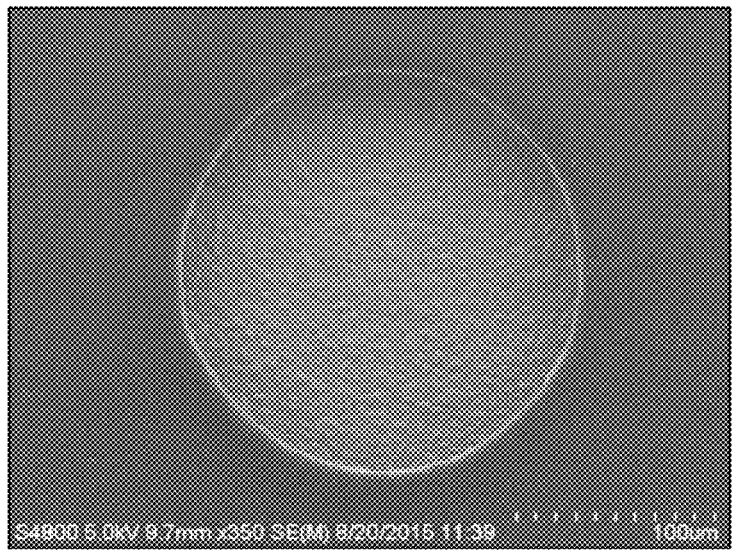
FIG. 34 is SEM image of copper pads of FIG. 31 after PCB coupon reflow.
Figure 35:
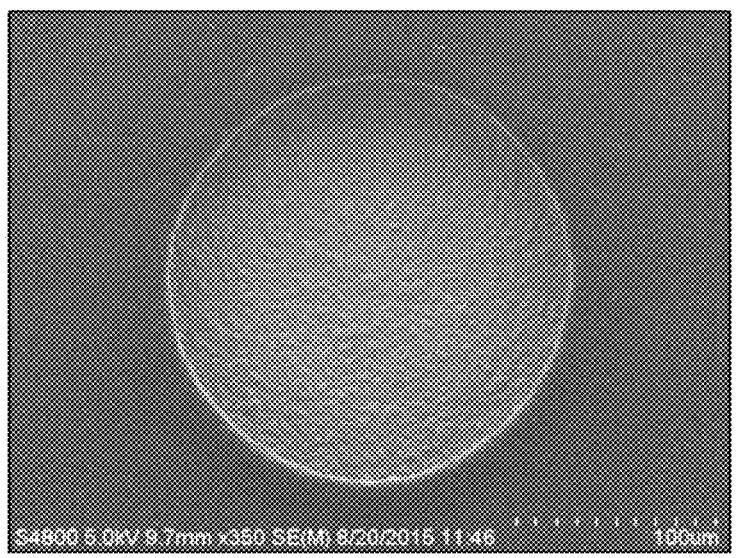
FIG. 35 is SEM image of copper pads after PCB coupon reflow where DEHT was not applied.

FIG. 34 is SEM image with 350× magnification of side of copper pads FIG. 31 after reflowing PCB coupon, and FIG. 35 is SEM image with 350× magnification of PCB coupon after reflow where DEHT was not applied.

Figure 36:
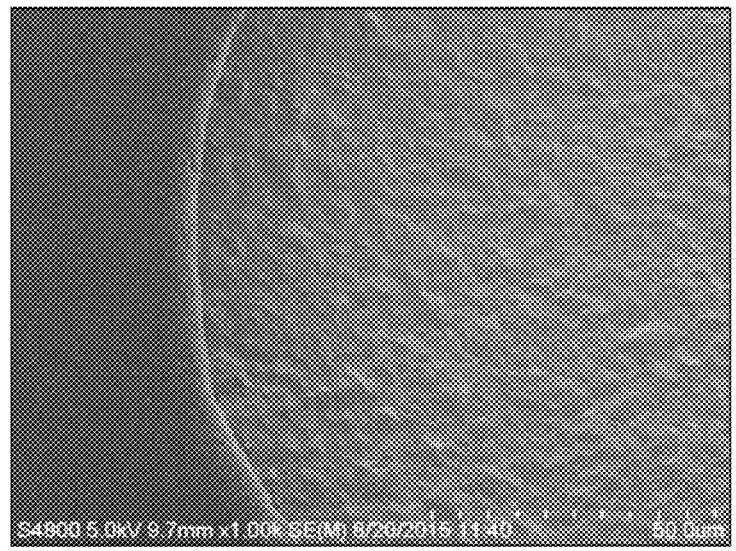
FIG. 36 is SEM image of side of copper pads of FIG. 31 after PCB coupon reflow.
Figure 37:
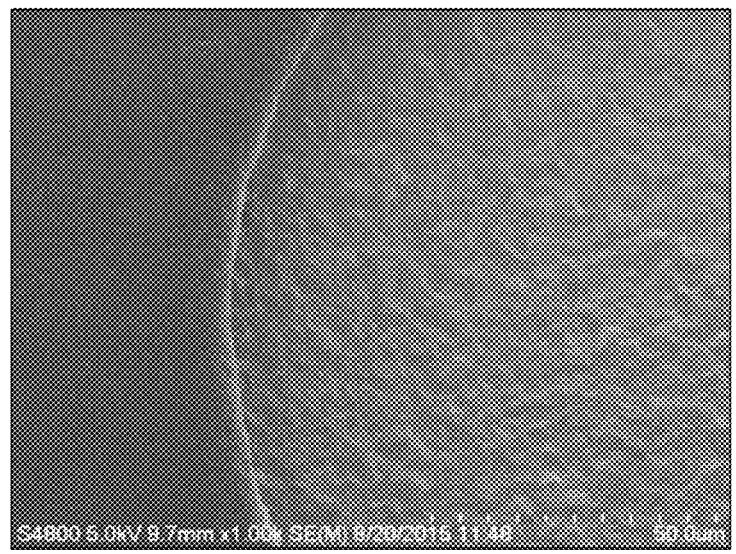
FIG. 37 is SEM image of side of copper pads after reflow where DEHT was not applied.

FIG. 36 is SEM image with 1000× magnification of side of copper pads FIG. 31 after reflowing PCB coupon, and FIG. 37 is SEM image with 1000× magnification of side of copper pads after reflowing PCB coupon where DEHT was not applied.

Figure 38:
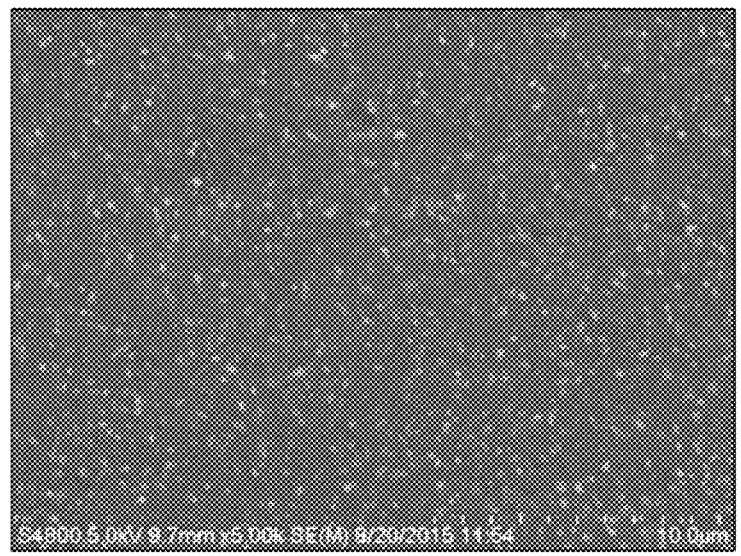
FIG. 38 is SEM image of layer of passivation of FIG. 31 after PCB coupon reflow.
Figure 39:
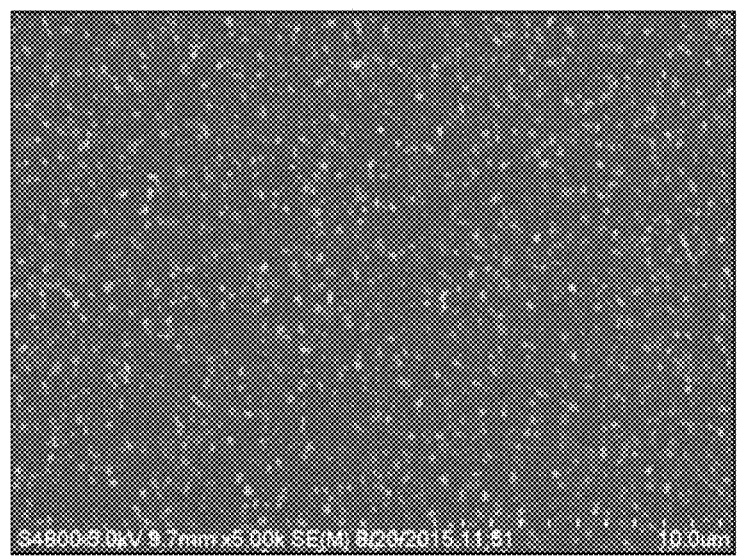
FIG. 39 is SEM image of layer of passivation after PCB coupon reflow where DEHT was not applied.

FIG. 38 is SEM image with 5000× magnification of layer of PCB passivation FIG. 31 after reflowing PCB coupon, and FIG. 39 is SEM image with 5000× magnification of layer of PCB passivation after reflowing PCB coupon where DEHT was not applied.

Comparing SEM images of each magnification, there is no difference between surface of PCB coupon after reflow with DEHT applied and surface of PCB coupon after reflow with no DEHT applied.

As a result of the experiment above, after reflow DEHT was removed without any residues.

Furthermore, the inventor used DEHT to attach a chip to a substrate and processed reflow then peeled a chip off from a substrate to observe residues of DEHT and joint between chip and a substrate.

Figure 40:
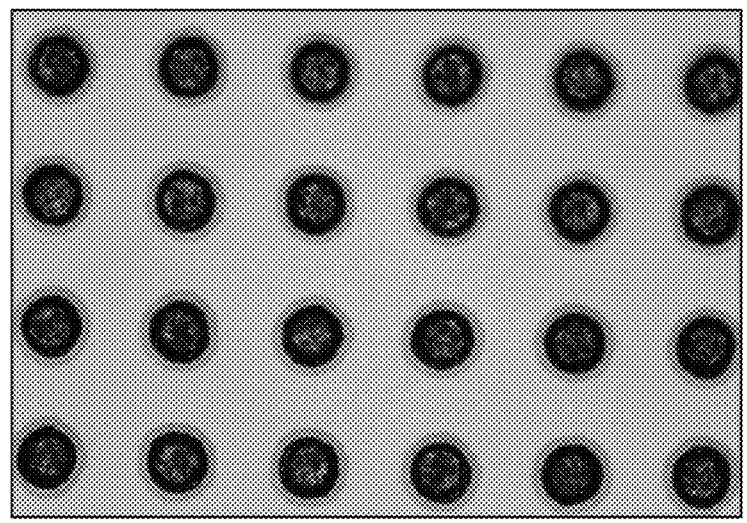
FIG. 40 is an image of a substrate that has peeled off after reflowing a chip where it was attached by DEHT.

FIG. 40 shows an image of a substrate after peeling off a chip which was attached using DEHT then processed reflow. As illustrated in FIG. 40, the joint between a chip and a substrate, where DEHT was applied to attach, is well shaped without any residues of DEHT on substrate.

Also, to confirm the adhesion strength of DEHT the inventor applied DEHT film to Cu-clad wafer coupon and attached LFS balls with 250 μm size and shook the wafer coupon and tilted vertically.

Figure 41:
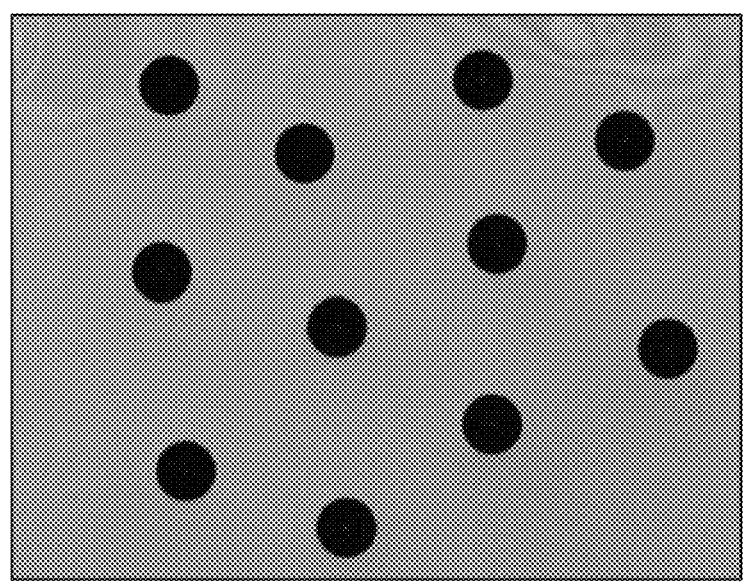
FIG. 41 is an image of Cu-clad wafer coupon right after attaching solder balls with DEHT film.
Figure 42:
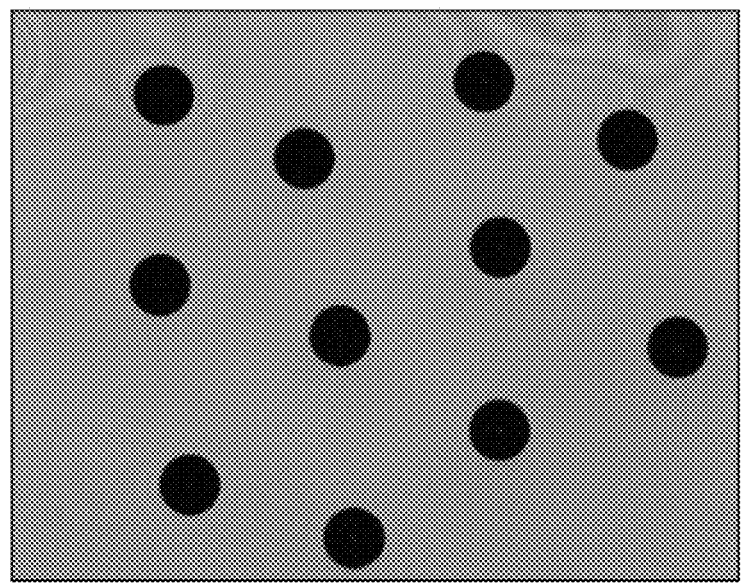
FIG. 42 is an image of wafer coupon after shaking and tilting vertically.

FIG. 41 shows image right after attaching solder balls to Cu-clad wafer coupon using DEHT film, and FIG. 42 shows an image of wafer coupon of FIG. 41 after shaking and tilting vertically.

Figure 43:
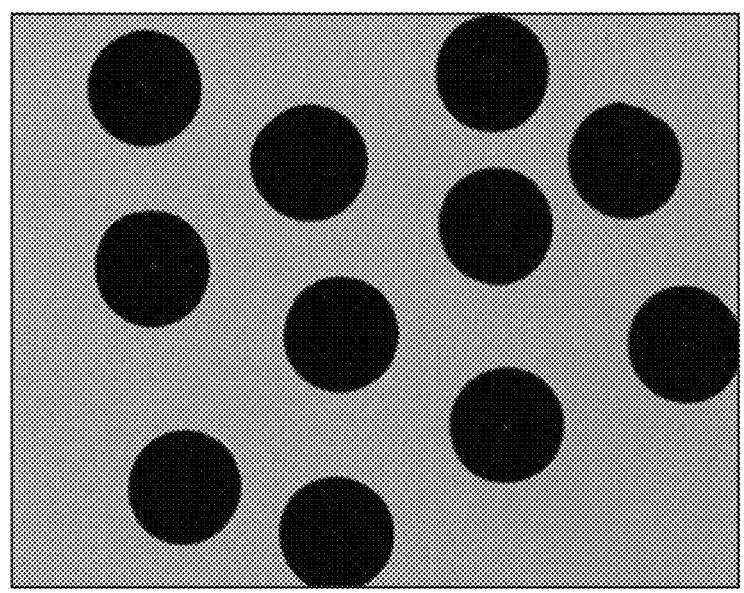
FIG. 43 is an image of wafer coupon of FIG. 41 after reflow.

Comparing FIGS. 41 and 42, the solder balls applied with DEHT has not changed their positions by the movement of wafer coupon. Also, shown in FIG. 43 the solder balls has not changed their positions after wafer coupon reflow.

Another way to test to confirm the adhesion strength of DEHT, the inventor applied DEHT film to Cu-clad wafer coupon and attached solder balls with 250 μm size and drove for several days while the wafer coupon was in the trunk. This experiment simulated transporting products by car during semiconductor manufacturing.

Figure 44:
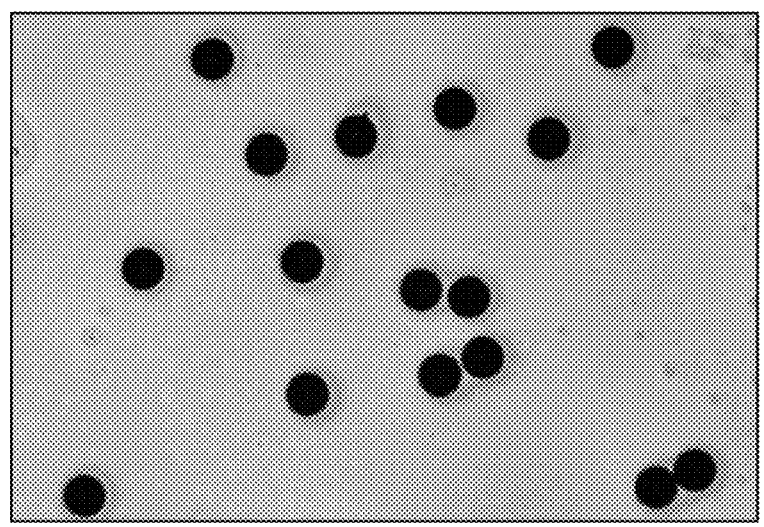
FIG. 44 is an image of Cu-clad attaching solder balls with DEHT film.
Figure 45:
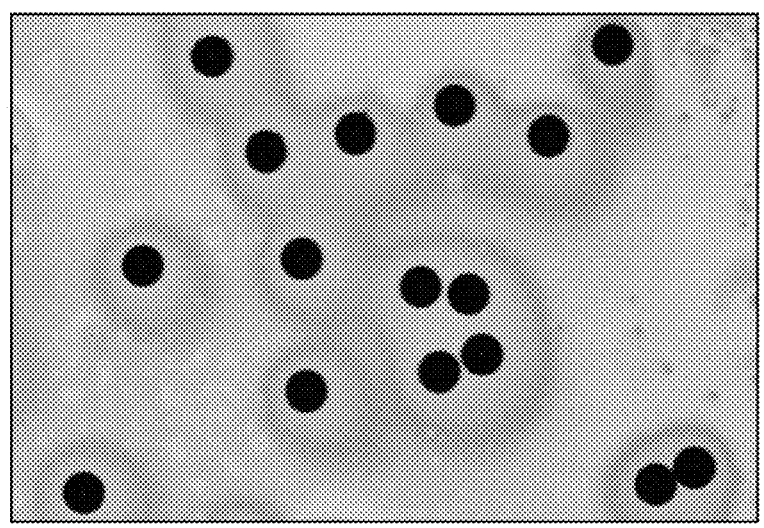
FIG. 45 is an image of wafer coupon of FIG. 44 after transport test.

FIG. 44 shows an image of Cu-clad wafer coupon attached with solder balls with DEHT film, and FIG. 45 shows an image of wafer coupon of FIG. 44 after transport test.

Comparing FIGS. 44 and 45, there is no change in positions of solder balls attached to the Cu-clad wafer coupon with DEHT.

Lastly, the inventor applied DEHT film to wafer coupon having copper pads and attached solder balls that was randomly scattered then processed reflow.

Figure 46:
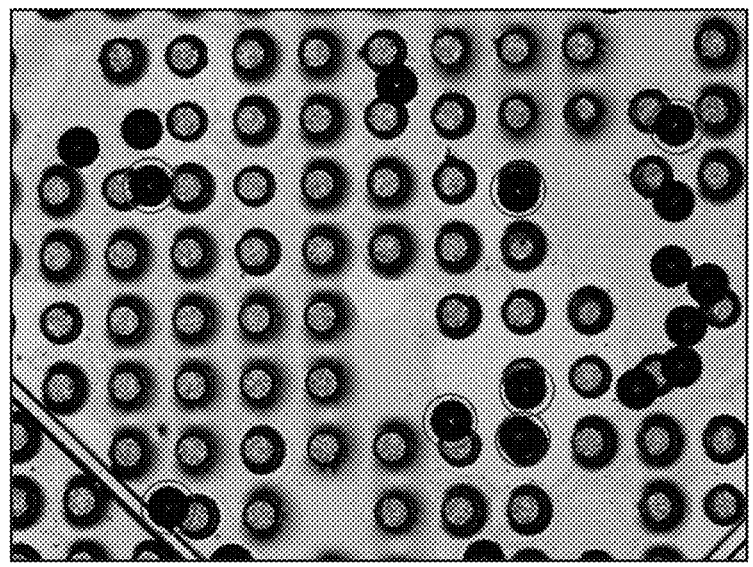
FIG. 46 is an image of wafer coupon having copper pads applying DEHT film then randomly scattering solder balls.
Figure 47:
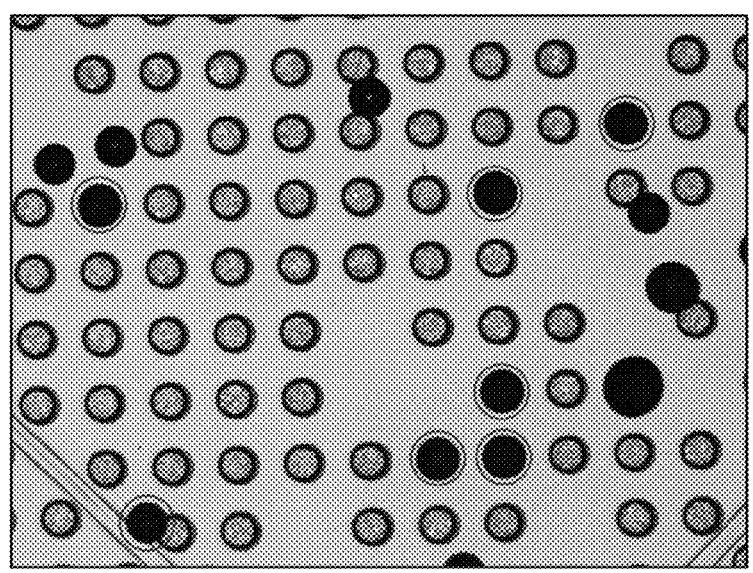
FIG. 47 is an image of wafer coupon of FIG. 46 after reflow.
Figure 48:
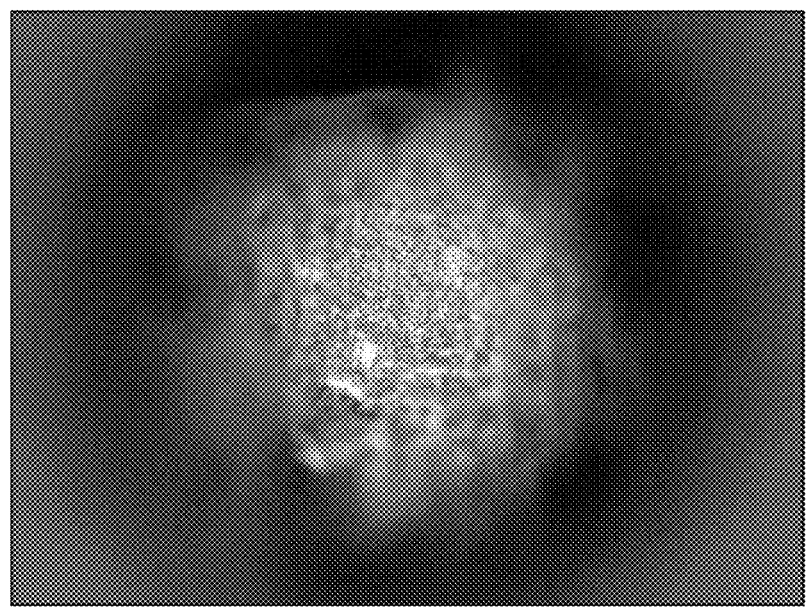
FIG. 48 is an image of surface of solder balls of FIG. 46 fixed to copper pads after reflowing wafer coupon.

FIG. 46 shows an image of wafer coupon having copper pads applied with DEHT film and randomly scattered solder balls, FIG. 47 shows an image of wafer coupon of FIG. 46 after reflow, and FIG. 48 shows and image of side of solder balls of FIG. 46 fixed to copper pads after wafer coupon reflow.

Referring to FIGS. 46 and 47, the solder balls (red circles in FIG. 46) attached adjacent to the middle of the copper pads were self-aligned on the pad after reflow. Also, there were no residues of DEHT on wafer coupon after reflow, and as shown in FIG. 48 the solder balls had a smooth surface and twinkling rounded shape.

Through the above-described tests, where DEHT was used to attach the devices in the reflow process, it was confirmed that the devices bond well to each other without the need for separate cleaning and drying processes to remove adhesive residue before the inspection. Therefore, according to the foregoing embodiments, when compared to the reflow process using the typical flux, the number of processes may be reduced to improve productivity and eliminate harmful effects to the human body, equipment, and the environment.

The present invention has been described above with reference to the embodiments, but this is merely described, for example, the technical idea of the present invention, and thus is not limited thereto. It should be understood that various embodiments of the present invention are conceivable to a person skilled in the art. The scope of the present invention will depend only upon the appended claims.

What is claimed is:

1. A device packaging method comprising:
providing bis(2-ethylhexyl) terephthalate (DEHT) between first and second devices to attach the first and second devices to each other;
thermally processing the first and second devices that are attached to each other to remove the DEHT; and
thermally processing the first and second devices to fix the first and second devices to each other.

2. The device packaging method of claim 1, wherein the first device comprises at least one of a solder ball, a semiconductor chip, and a substrate, and
the second device comprises at least one of the semiconductor chip and the substrate.

3. The device packaging method of claim 1, wherein the providing DEHT between first and second devices to attach the first and second devices comprises:
immersing a protruding portion of the first device in the DEHT to apply the DEHT to the protruding portion; and
moving at least one of the first and second devices to allow the protruding portion to contact the second device.

4. The device packaging method of claim 1, wherein the providing DEHT between first and second devices to attach the first and second devices comprises:
applying the DEHT to at least one of the first and second devices; and
moving at least one of the first and second devices to allow the first and second devices to contact each other on a portion coated with the DEHT.

5. The device packaging method of claim 1, wherein the providing DEHT between first and second devices to attach the first and second devices comprises:

providing a film formed of the DEHT to at least one of the first and second devices; and moving at least one of the first and second devices to allow the first and second devices to contact each other on a portion coated with the DEHT.

6. The device packaging method of claim 1, wherein the providing DEHT between first and second devices to attach the first and second devices comprises:

contacting the first and second devices with each other; and providing the DEHT to an edge of a contact portion between the first and second devices to allow the DEHT to be absorbed onto a boundary between the first and second devices.

7. The device packaging method of claim 1, wherein the thermally processing the first and second devices that are attached to each other to remove the DEHT comprises preheating the first and second devices that are attached to each other at a first temperature to remove the DEHT, and the thermally processing the first and second devices to fix the first and second devices to each other comprises heating the first and second devices at a second temperature that is greater than the first temperature to melt a bonding material disposed on a contact portion between the first and second devices, and cooling the first and second devices at a third temperature that is less than the second temperature to solidify the bonding material.

8. The device packaging method of claim 7, wherein the first temperature is lower than a boiling point of the DEHT, the second temperature is greater than or equal to a melting point of the bonding material, and the third temperature is less than the melting point of the bonding material.

9. The device packaging method of claim 8, wherein the thermally processing the first and second devices that are attached to each other to remove the DEHT comprises preheating the first and second devices that are attached to each other at the first temperature while exposing the first and second devices to nitrogen or nitrogen containing formic acid vapor.

10. The device packaging method of claim 8, further comprising, after the thermally processing of the first and second devices that are attached to each other to remove the DEHT, heating the first and second devices at a fourth temperature that is greater than the first temperature under an atmospheric pressure or a pressure that is less than the atmospheric pressure while exposing the first and second devices to formic acid vapor to remove impurities formed on a surface of the bonding material.

11. The device packaging method of claim 1, wherein the thermally processing the first and second devices that are attached to each other to remove the DEHT comprises preheating the first and second devices that are attached to each other at a temperature of about 180° C. to about 220° C.

12. The device packaging method of claim 11, wherein the preheating of the first and second devices comprises preheating the first and second devices that are attached to each other at the temperature of about 180° C. to about 220° C. for about 60 seconds.

13. The device packaging method of claim 1, wherein the thermally processing the first and second devices that are attached to each other to remove the DEHT comprises preheating the first and second devices that are attached to each other under an atmospheric pressure or a pressure that is less than the atmospheric pressure.

14. The device packaging method of claim 1, further comprising:

taking the first and second devices that are fixed to each other out of the device packaging facility; and inspecting the first and second devices that are fixed to each other at an inspection facility.

* * * * *